United States Patent
Tan et al.

(10) Patent No.: US 12,191,882 B1
(45) Date of Patent: Jan. 7, 2025

(54) DECODERS, DECODING METHODS, MEMORY CONTROLLERS AND MEMORY SYSTEMS

(71) Applicant: Yangtze Memory Technologies Co., Ltd., Hubei (CN)

(72) Inventors: Hua Tan, Hubei (CN); ChuangChuang Zhao, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 18/475,024

(22) Filed: Sep. 26, 2023

(30) Foreign Application Priority Data

Jun. 25, 2023 (CN) .......................... 202310757468.4

(51) Int. Cl.
H03M 13/00 (2006.01)
H03M 13/11 (2006.01)

(52) U.S. Cl.
CPC ..... H03M 13/1105 (2013.01); H03M 13/616 (2013.01)

(58) Field of Classification Search
CPC ............. H03M 13/616; H03M 13/116; H03M 13/1102; H03M 13/118; H03M 13/255; H03M 13/1185; H03M 13/1134; H03M 13/1177; H03M 13/1148
See application file for complete search history.

(56) References Cited

U.S. PATENT DOCUMENTS

| | | | | |
|---|---|---|---|---|
| 9,503,124 | B2 * | 11/2016 | Sunwoo | H03M 13/1131 |
| 10,484,012 | B1 * | 11/2019 | Tunali | H03M 13/1125 |
| 10,581,460 | B2 * | 3/2020 | Liu | H03M 13/116 |
| 10,778,249 | B2 * | 9/2020 | Heo | H03M 13/114 |
| 10,879,929 | B2 * | 12/2020 | Liu | H03M 13/1137 |
| 10,879,935 | B2 * | 12/2020 | Kim | G06F 11/10 |
| 11,005,499 | B2 * | 5/2021 | Kim | H03M 13/114 |
| 11,258,460 | B2 * | 2/2022 | Declercq | H03M 13/6505 |
| 11,309,916 | B2 * | 4/2022 | Kim | H03M 13/116 |
| 11,381,255 | B2 * | 7/2022 | Reynwar | H03M 13/1137 |

* cited by examiner

Primary Examiner — Esaw T Abraham
(74) Attorney, Agent, or Firm — HANLEY, FLIGHT & ZIMMERMAN, LLC

(57) ABSTRACT

The present disclosure provides a decoder including: a check node updating circuit and a variable node updating circuit. In a first time period, these circuits obtain the check node messages corresponding to different layers of the check matrix in the first updating units of different levels in the first updating units of $\alpha$ levels and obtain corresponding intermediate calculation values in the second updating units of different levels in the second updating units of $\alpha$ levels. After, the second updating units sequentially receive the check node messages corresponding to each layer of the check matrix and calculate the received check node messages with the intermediate calculation values of the second updating unit of the next level. From this, they obtain the variable node messages corresponding to different columns of the check matrix in the second updating units of different levels in the second updating units of $\alpha$ levels.

20 Claims, 8 Drawing Sheets

DECODERS, DECODING METHODS, MEMORY CONTROLLERS AND MEMORY SYSTEMS

REFERENCE TO RELATED APPLICATION

This application claims priority to and the benefit of Chinese Patent Application 202310757468.4, filed on Jun. 25, 2023, which is hereby incorporated by reference in its entirety.

TECHNICAL FIELD

The present disclosure relates to, but is not limited to, a decoder, a decoding method, a memory controller, a memory system and an electronic device.

BACKGROUND

With the rapid development of data storage technologies, more and more data memory systems, such as solid state drives (SSD) and so on, appear in electronic devices used by people. SSDs have been widely used in military, vehicle, industrial, medical and aviation fields because of their characteristics in terms of fast reading and writing, anti-vibration, low power consumption, no noise, low heat and light weight.

DETAILED DESCRIPTION

Figure 1:
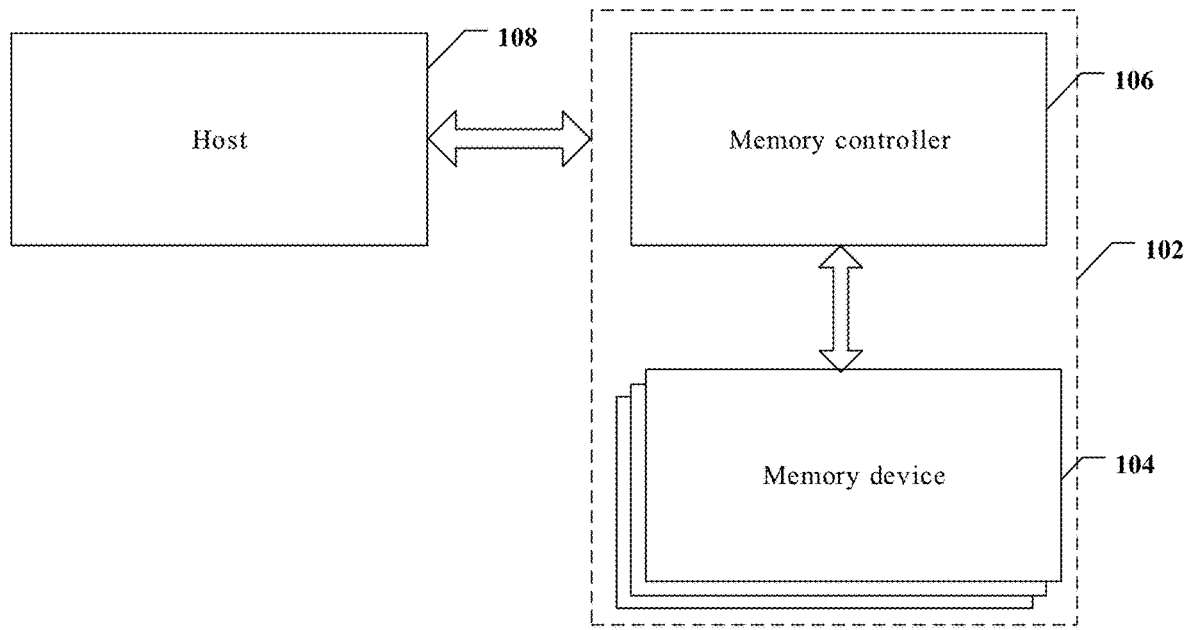
FIG. 1 is a schematic diagram of an example system with a memory system according to an example of the present disclosure.

Examples of the present disclosure will be described in more detail below with reference to the accompanying drawings. Although examples of the present disclosure are shown in the drawings, it should be understood that the present disclosure may be implemented in various ways and should not be limited to the DETAILED DESCRIPTION set forth herein. Rather, these examples are provided so that the present disclosure can be more thoroughly understood and the scope of the present disclosure can be fully conveyed to those skilled in the art.

In the following description, numerous specific details are given in order to provide a more thorough understanding of the present disclosure. It will be apparent, however, to one skilled in the art that the present disclosure may be practiced without one or more of these details. In other examples, some technical features well-known in the art are not described to avoid confusion with the present disclosure; that is, not all features of the actual example are described here, and well-known functions and structures are not described in detail.

In the drawings, the size of layers, regions, elements and their relative sizes may be exaggerated for clarity. Like reference numerals refer to like elements throughout.

It will be understood that when an element or layer is referred to as being "on," "adjacent to," "connected to" or "coupled to" another element or layer, it can be directly on, adjacent to, connected to, or coupled to other elements or layers, or intervening elements or layers may be present. In contrast, when an element is referred to as being "directly on," "directly adjacent to," "directly connected to" or "directly coupled to" another element or layer, there are no intervening elements or layers. It will be understood that, although the terms such as first, second, third etc. may be used to describe at least one of various elements, components, regions, layers or sections, at least one of these elements, components, regions, layers or sections should not be limited by these terms. These terms are only used to distinguish one element, component, region, layer or section from another element, component, region, layer or section. Thus, a first element, component, region, layer or section discussed below could be represented as a second element, component, region, layer or section without departing from the teachings of the present disclosure. When a second element, component, region, layer or section is discussed, it does not indicate that a first element, component, region, layer or section necessarily exists in the present disclosure.

Spatial terms such as "under", "below", "beneath", "underneath", "on", "above" and so on, can be used here for convenience to describe the relationship between one element or feature and other elements or features shown in the figures. It will be understood that the spatially relationship terms also comprise different orientations of the device in use and operation in addition to the orientation depicted in the figures. For example, if the device in the figures is turned over, elements or features described as "below" or "underneath" or "under" other elements or features would then be oriented as "above" the other elements or features. Thus, the example terms "below" and "under" can comprise both orientations of above and below. The device may be otherwise oriented (rotated 90 degrees or at other orientations) and the spatial descriptors used herein may be interpreted accordingly.

The terminology used herein is for the purpose of describing particular examples only and is not to be taken as a limitation of the present disclosure. As used herein, "a", "an" and "said/the" in singular forms are intended to include the plural forms as well, unless the context clearly dictates otherwise. It should also be understood that at least one of the terms "consists of" or "comprising", when used in this specification, identify the presence of at least one of stated features, integers, operations, elements or components, but do not exclude presence or addition of at least one of one or more other features, integers, operations, elements, components or groups. As used herein, the term "at least one of . . . or . . . " includes any and all combinations of the associated listed items.

For ease of understanding the characteristics and technical content of the examples of the present disclosure in more detail, the examples of the present disclosure will be described in detail below in conjunction with the accompanying drawings. The attached drawings are only for reference and description, and are not intended to limit the examples of the present disclosure.

FIG. 1 illustrates a block diagram of an example system 100 having memory, according to some aspects of the present disclosure. System 100 may be a mobile phone, a desktop computer, a laptop computer, a tablet, a vehicle computer, a gaming console, a printer, a positioning device, a wearable electronic device, a smart sensor, a virtual reality (VR) device, an argument reality device, or any other suitable electronic devices having storage therein. As shown in FIG. 1, system 100 may include a host 108 and a memory system 102 having one or more memory device 104 and a memory controller 106. Host 108 may be a processor of an electronic device, such as a central processing unit, or a system-on-chip, such as an application processor. Host 108 may be configured to send or receive data to or from memory device 104.

Memory controller 106 is coupled to memory device 104 and host 108 and is configured to control memory device 104, according to some examples. Memory controller 106 may manage the data stored in memory device 104 and communicate with host 108. In some examples, memory controller 106 is designed for operating in a low duty-cycle environment like secure digital cards, compact Flash cards, universal serial bus Flash drives, or other media for use in electronic devices, such as personal computers, digital cameras, mobile phones, etc. In some examples, memory controller 106 is designed for operating in a high duty-cycle environment SSD or embedded multi-media-cards used as data storage for mobile devices, such as smartphones, tablets, laptop computers, etc., and enterprise storage arrays.

Memory controller 106 may be configured to control operations of memory device 104, such as read, erase, and program operations. Memory controller 106 may also be configured to manage various functions with respect to the data stored or to be stored in memory device 104 including, but not limited to bad-block management, garbage collection, logical-to-physical address conversion, wear leveling, etc. In some examples, memory controller 106 is further configured to process error correction codes with respect to the data read from or written to memory device 104. Any other suitable functions may be performed by memory controller 106 as well, for example, formatting memory device 104. Memory controller 106 may communicate with an external device (e.g., host 108) according to a particular communication protocol. For example, memory controller 106 may communicate with the external device through at least one of various interface protocols, such as a Universal Serial Bus (USB) protocol, an Multi-Media Card (MMC) protocol, a peripheral component interconnect protocol, a peripheral component interconnect express protocol, an advanced technology attachment protocol, a serial advanced technology attachment protocol, a parallel advanced technology attachment protocol, a small computer small interface protocol, an enhanced small disk interface protocol, an integrated drive electronics protocol, a firmware protocol, etc.

Figure 2A:
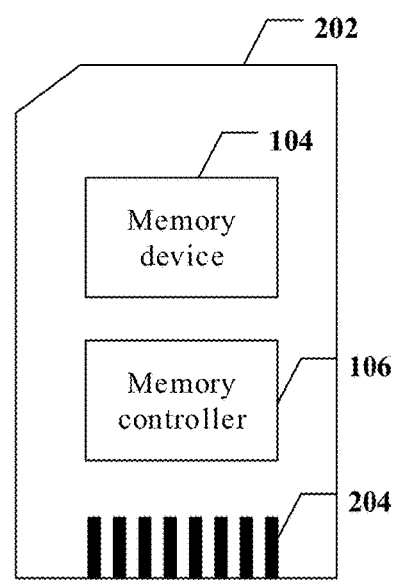
FIG. 2A is a schematic diagram of an example memory card with a memory system according to an example of the present disclosure.
Figure 2B:
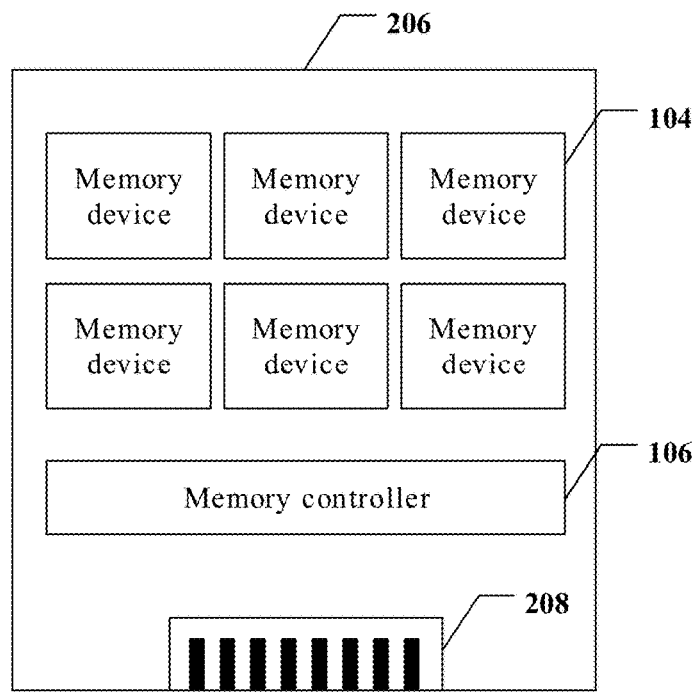
FIG. 2B is a schematic diagram of an example solid state drive with a memory system according to an example of the present disclosure.

Memory controller 106 and one or more memory devices 104 may be integrated into various types of storage devices, for example, be included in the same package, such as a universal Flash storage (UFS) package or an embedded Multi-Media Card package. That is, memory system 102 may be implemented and packaged into different types of end electronic products. In one example as shown in FIG. 2A, memory controller 106 and a single memory device 104 may be integrated into a memory card 202. Memory card 202 may include a compact Flash card, a smart media card, a memory stick, a multimedia card, a secure digital card, a UFS, etc. Memory card 202 may further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 may further include an SSD connector 208 coupling SSD 206 with a host (e.g., host 108 in FIG. 1). In some examples, at least one of the storage capacity or the operation speed of SSD 206 is greater than those of memory card 202.

Figure 3A:
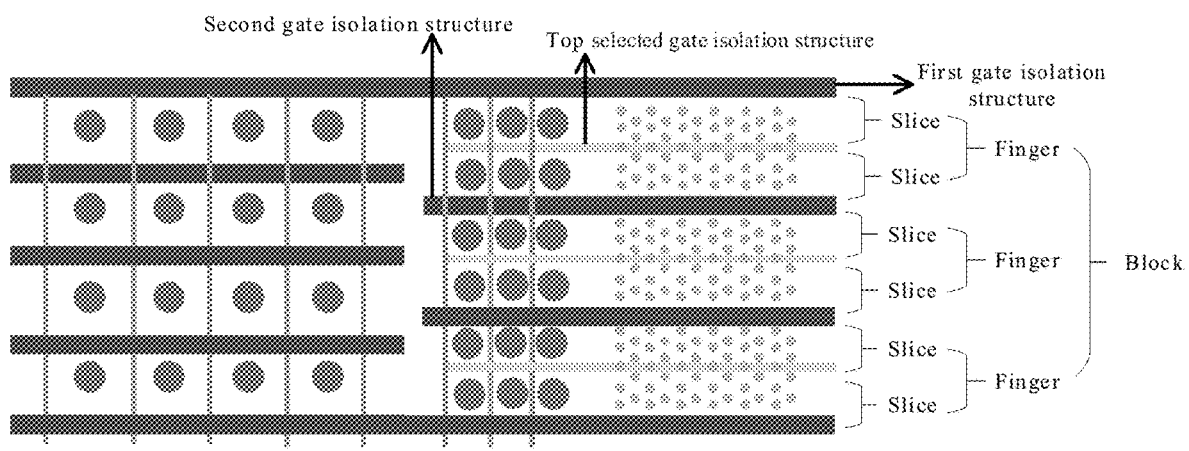
FIG. 3A is a schematic diagram of the distribution of memory cells of a three-dimensional NAND memory according to an example of the present disclosure.

FIG. 3A exemplarily provides a structural schematic diagram of a memory array of a three-dimensional NAND memory. As shown in FIG. 3A, the memory array of a three-dimensional NAND memory consists of several memory cell rows parallel to gate isolation structure and staggered in parallel. Every four rows of the memory cell rows are separated by a gate isolation structure and a top selected gate isolation structure, and each memory cell row includes a plurality of memory cells. The gate isolation structure may include a first gate isolation structure and a second gate isolation structure. The first gate isolation structure divides the memory array into a plurality of blocks, the plurality of second gate isolation structures may divide the block into multiple fingers, and the top selected gate isolation structure provided in the middle of each finger may divide the finger into two parts, so that the finger is divided into two slices. A block shown in FIG. 3A contains 6 slices, and in practical applications, the number of slices in a block is not so limited. The memory cells in a slice coupled to a certain word line may be referred to as a page, which is a physical page here.

It should be noted that the number of memory cell rows between the gate isolation structure and the top selected gate isolation structure shown in FIG. 3A is merely an example, and is not used for limiting the number of memory cell rows contained in one finger of the three-dimensional NAND memory in the present disclosure. In practical applications, the number of memory cell rows contained in one finger may be adjusted according to actual conditions, such as 2, 4, 8, 16, and so on.

Figure 3B:
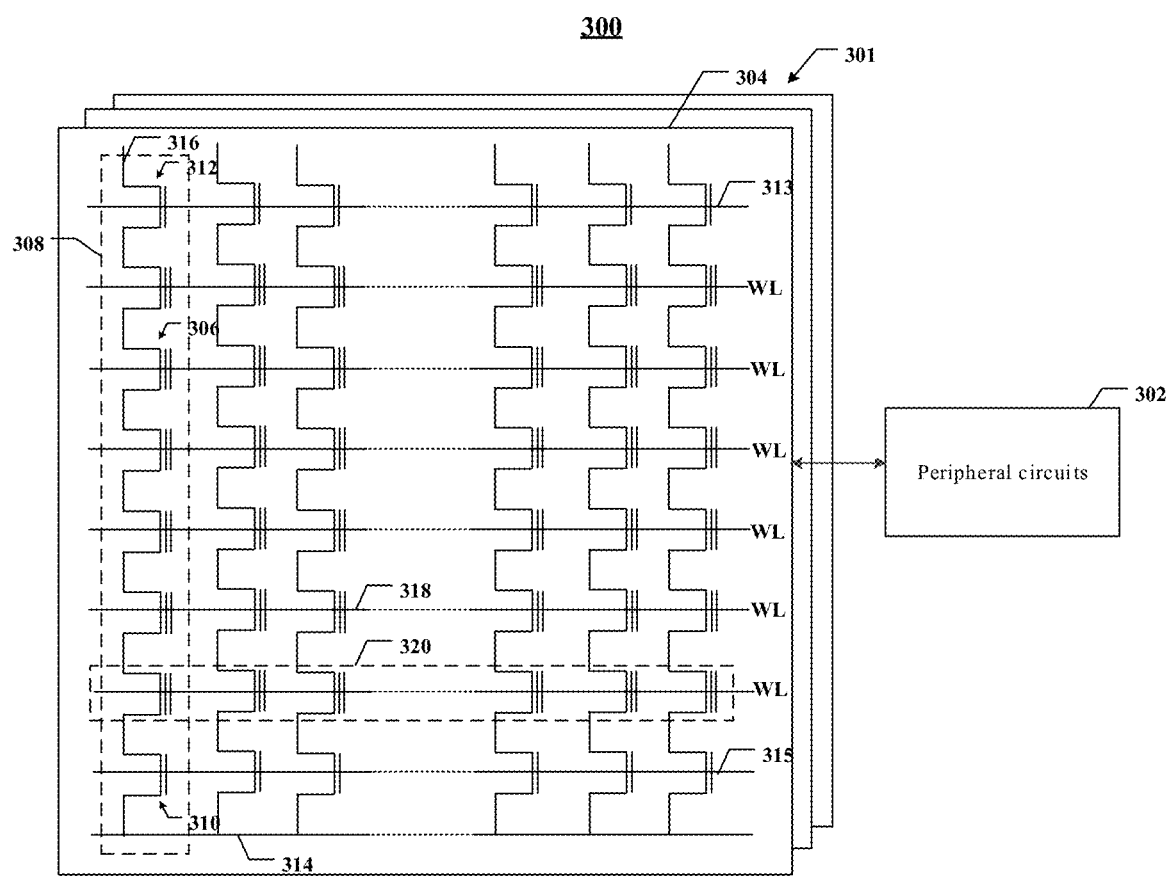
FIG. 3B is a schematic diagram of an example memory device including peripheral circuits according to an example of the present disclosure.

FIG. 3B illustrates a schematic circuit diagram of an example memory device 300 including peripheral circuits, according to some aspects of the present disclosure. The memory device 300 may be an example of the memory device 104 in FIG. 1. The memory device 300 may include a memory array 301 and peripheral circuits 302 coupled to memory array 301. The memory array 301 is illustrated as an example of a three-dimensional NAND memory array, in which memory cells 306 are NAND memory cells and are provided in the form of an array of memory strings 308 each extending vertically above a substrate (not shown). In some examples, each memory string 308 includes a plurality of memory cells 306 coupled in series and stacked vertically. Each memory cell 306 may hold a continuous, analog value, such as a voltage or charge, that depends on the number of electrons trapped within a region of memory cell 306. Each memory cell 306 may be either a floating gate type of memory cell including a floating-gate transistor or a charge trap type of memory cell including a charge-trap transistor.

In some examples, each memory cell 306 is a single-level cell (SLC) that has two possible memory states and thus, may store one bit of data. For example, the first memory state "0" may correspond to a first range of voltages, and the second memory state "1" may correspond to a second range of voltages. In some examples, each memory cell 306 is a multi-level cell (MLC) that is capable of storing more than single bit of data in more than four memory states. For example, the MLC may store two bits per cell, three bits per cell (also known as triple-level cell (TLC)), or four bits per cell (also known as a quad-level cell (QLC)). Each MLC may be programmed to assume a range of possible nominal storage values. In one example, if each MLC stores two bits of data, then the MLC may be programmed to assume one of three possible programming levels from an erased state by writing one of three possible nominal storage values to the cell, and a fourth nominal storage value may be used for the erased state.

As shown in FIG. 3B, each memory string 308 may include a bottom selected transistor (BST) 310 at its source end and a top selected transistor (TST) 312 at its drain end. BST 310 and TST 312 may be configured to activate selected memory strings 308 during read and program operations. In some examples, the sources of memory strings 308 in a same block 304 are coupled through a same source line (SL) 314. e.g., a common SL. In other words, all memory strings 308 in the same block 304 have an array common source (ACS), according to some examples. TST 312 of each memory string 308 is coupled to a respective bit line (BL) 316 from which data may be read or written via an output bus (not shown), according to some examples. In some examples, each memory string 308 is configured to be selected or deselected by at least one of applying a select voltage (e.g., above the threshold voltage of the transistor having TST 312) or a deselect voltage (e.g., 0 V) to respective TST 312 through one or more top selected lines (TSL) 313 or applying a select voltage (e.g., above the threshold voltage of the transistor having BST 310) or a deselect voltage (e.g., 0 V) to respective BST 310 through one or more bottom selected line (BSL) 315.

As shown in FIG. 3B, memory strings 308 may be organized into multiple blocks 304, each of which may have a common source line 314, e.g., coupled to the ground. In some examples, each block 304 is the basic data unit for erase operations, i.e., all memory cells 306 on the same block 304 are erased at the same time. To erase memory cells 306 in a selected block 304, source lines 314 coupled to selected block as well as unselected blocks in the same plane as selected block may be biased with an erase voltage (Vers), such as a high positive voltage (e.g., 20 V or more). It is understood that in some examples, erase operation may be performed at a half-block level, a quarter-block level, or a level having any suitable number of blocks or any suitable fractions of a block. Memory cells 306 of adjacent memory strings 308 may be coupled through word lines 318 that select which row of memory cells 306 is affected by read and program operations. In some examples, each word line 318 is coupled to a page 320 of memory cells 306. The size of one page 320 in bits may relate to the number of memory strings 308 coupled by word line 318 in one block 304. Each word line 318 may include a plurality of control gates (gate electrodes) at each memory cell 306 in respective page 320 and a gate line coupling the control gates. In combination with FIG. 3A above, one page 320 includes a plurality of memory cells 306, and the plurality of memory cells are isolated by the top selected gate isolation structure and the gate isolation structure. The multiple memory cells between the top selected gate isolation structure and the gate isolation structure are arranged into multiple memory cell rows, and each memory cell row is parallel to the gate isolation structure and the top selected gate isolation structure. Memory cells in slices that share a same word line form a programmable (read/write) page.

Figure 4:
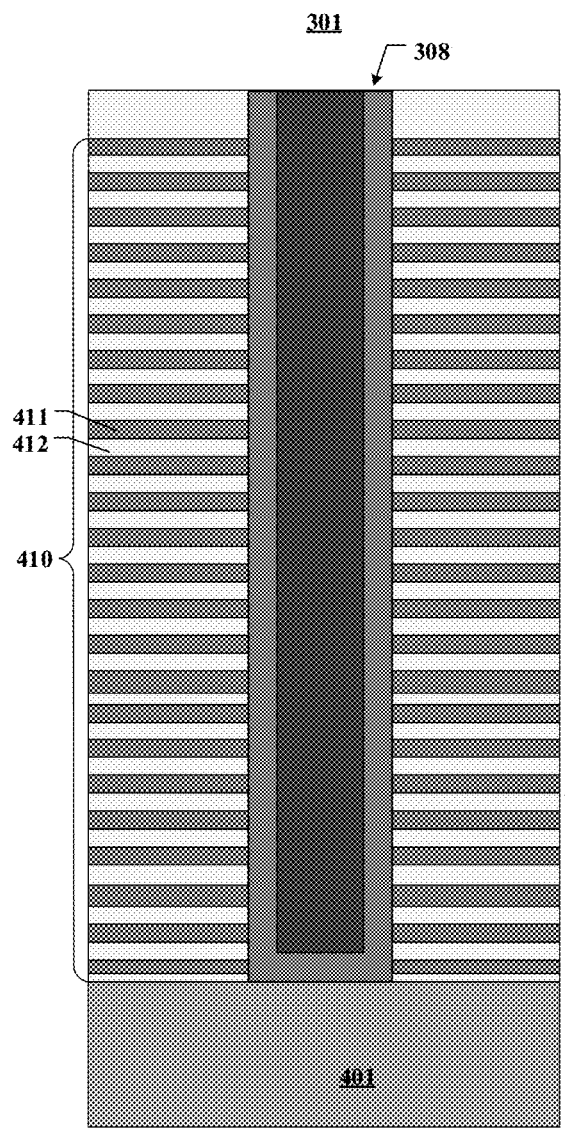
FIG. 4 is a schematic cross-sectional view of a memory array including memory strings according to an example of the present disclosure.

FIG. 4 shows a schematic cross-sectional view of an example memory array 301 including memory strings 308 in accordance with aspects of the present disclosure. As shown in FIG. 4, the memory string 308 may include a stacked structure 410, which includes a plurality of gate layers 411 and a plurality of insulating layers 412 alternately stacked in sequence, and a memory string 308 vertically penetrating through the gate layers 411 and the insulating layers 412. The gate layer 411 and the insulating layer 412 may be stacked alternately, and two adjacent gate layers 411 are separated by an insulating layer 412. The number of memory cells included in the memory array 301 is mainly related to the number of pairs of gate layers 411 and insulating layers 412 in the stacked structure 410.

The constituent material of the gate layer 411 may include a conductive material. The conductive material may include but is not limited to tungsten (W), cobalt (Co), Copper (Cu), aluminum (Al), polysilicon, doped silicon, silicide, or any combination thereof. In some examples, each gate layer 411 includes a metal layer, e.g., a tungsten layer. In some examples, each gate layer 411 includes a doped polysilicon layer. Each gate layer 41 may include a control gate surrounding the memory cell. The gate layer 411 at the top of the stacked structure 410 may extend laterally as a top selected gate line, the gate layer 411 at the bottom of the stacked structure 410 may extend laterally as a bottom selected gate line, and the gate layer 411 extending laterally between the top selected gate line and the bottom selected gate line may be used as a word line layer.

In some examples, the stacked structure 410 may be disposed on a substrate 401. The substrate 401 may include silicon (e.g., monocrystalline silicon), silicon germanium (SiGe), gallium arsenide (GaAs), germanium (Ge), silicon-on-insulator (SOI), germanium-on-insulator (GOI), or any other suitable material.

In some examples, memory string 308 includes a channel structure extending vertically through the stacked structure 410. In some examples, the channel structure includes a channel hole filled with semiconductor material(s) (e.g., as a semiconductor channel) and dielectric material(s) (e.g., as a memory film). In some examples, the semiconductor channel includes silicon, e.g., polysilicon. In some examples, the memory film is a composite dielectric layer including a tunneling layer, a storage layer (also referred to as a "charge trap/storage layer"), and a blocking layer. The channel structure may have a cylindrical shape (e.g., a pillar shape). According to some examples, the semiconductor channel, the tunneling layer, the storage layer and the blocking layer are radially arranged in this order from the center of the pillar toward the outer surface of the pillar. The tunneling layer may include silicon oxide, silicon oxynitride, or any combination thereof. The storage layer may include silicon nitride, silicon oxynitride, or any combination thereof. The blocking layer may include silicon oxide, silicon oxynitride, a high dielectric constant (high-k) dielectric, or any combination thereof. In one example, the memory film may include a composite layer of silicon oxide/silicon oxynitride/silicon oxide (ONO).

Figure 5:
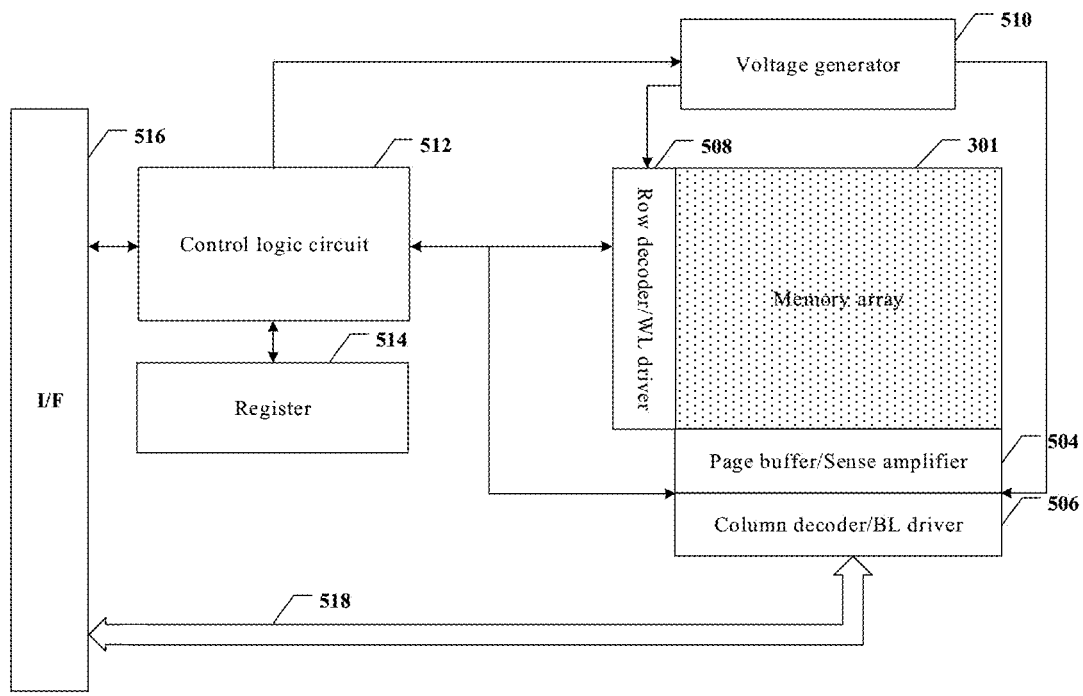
FIG. 5 is a schematic diagram of example memory including a memory array and peripheral circuits according to an example of the present disclosure.

Referring back to FIG. 3B, peripheral circuits 302 may be coupled to memory array 301 through bit lines 316, word lines 318, source lines 314, BSL 315, and TSL 313. Peripheral circuits 302 may include any suitable analog, digital, and mixed-signal circuits for facilitating the operations of memory array 301 by applying and sensing at least one of voltage signals or current signals to and from each target memory cell 306 through bit lines 316, word lines 318, source lines 314. BSL 315, and TSL 313. Peripheral circuits 302 may include various types of peripheral circuits formed using metal-oxide-semiconductor technologies. For example, FIG. 5 illustrates some example peripheral circuits, the peripheral circuits 302 including a page buffer/sense amplifier 504, a column decoder/bit line driver 506, a row decoder/word line driver 508, a voltage generator 510, control logic circuit 512, registers 514, an interface 516, and a data bus 518. It is understood that in some examples, additional peripheral circuits not shown in FIG. 5 may be included as well.

Page buffer/sense amplifier 504 may be configured to read and program (write) data from and to memory array 301 according to the control signals from control logic circuit 512. In one example, page buffer/sense amplifier 504 may store one page of program data (write data) to be programmed into one page 320 of memory array 301. In another example, page buffer/sense amplifier 504 may perform program verify operations to ensure that the data has been properly programmed into memory cells 306 coupled to selected word lines 318. In still another example, page buffer/sense amplifier 504 may also sense the low power signals from bit line 316 that represents a data bit stored in memory cell 306 and amplify the small voltage swing to recognizable logic levels in a read operation. Column dedecoder/bit line driver 506 may be configured to be controlled by control logic circuit 512 and select one or more memory strings 308 by applying bit line voltages generated from voltage generator 510.

Row dedecoder/word line driver 508 may be configured to be controlled by control logic circuit 512 and select/deselect blocks 304 of memory array 301 and select/deselect word lines 318 of block 304. Row dedecoder/word line driver 508 may be further configured to drive word lines 318 using word line voltages generated from voltage generator 510. In some examples, row dedecoder/word line driver 508 may also select/deselect and drive BSL 315 and TSL 313 as well. As described below in detail, row dedecoder/word line driver 508 is configured to perform program operations on the memory cells 306 coupled to the selected word line(s) 318. Voltage generator 510 may be configured to be controlled by control logic circuit 512 and generate the word line voltages (e.g., read voltage, program voltage, pass voltage, local voltage, verification voltage, etc.), bit line voltages, and source line voltages to be supplied to memory array 301.

Control logic circuit 512 may be coupled to each peripheral circuit described above and configured to control operations of each peripheral circuit. Registers 514 may be coupled to control logic circuit 512 and include status registers, command registers, and address registers for storing status information, command operation codes (OP codes), and command addresses for controlling the operations of each peripheral circuit. Interface 516 may be coupled to control logic circuit 512 and act as a control buffer to buffer and relay control commands received from a host (not shown) to control logic circuit 512, and to buffer and relay status information received from control logic circuit 512 to the host. Interface 516 may further be coupled to column dedecoder/bit line driver 506 via data bus 518 and act as a data 110 interface and data buffer to buffer and relay data to or from memory array 301.

The memory devices in implementations of the present disclosure include, but are not limited to, a three-dimensional NAND memory. For ease of understanding, taking the three-dimensional NAND memory as an example to explain the present disclosure.

As a kind of memory device which is more stable and more quick and convenient in terms of data reading and writing as compared to traditional disk storage, three-dimensional NAND memory has penetrated into every corner of daily life. In order to meet the increasing demand for storage, the size of three-dimensional NAND memory is shrinking, and the number of information bits in a single flash memory unit is increasing, the type of the memory cell is changing from SLC to MLC, TLC, QLC. As a result, the error probability of flash memory is increasing. The traditional BCH (Bose Chaudhuri Hocquenghem) error correction code is not enough to ensure the safety of data. The LDPC (Low Density Parity Check), as an error correction method whose error correction ability approaches Shannon limit, is gradually replacing BCH as an error correction coding method in the new generation of flash memory controllers.

Figure 6:
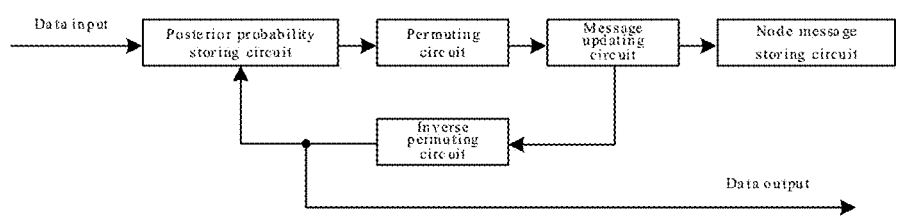
FIG. 6 is a schematic diagram of framework structure of a decoder according to an example of the present disclosure.

FIG. 6 is a schematic diagram of the framework structure of a decoder proposed in the examples of the present disclosure. As shown in FIG. 6, the decoder includes a posterior probability storing circuit, a permutating circuit, a message updating circuit, an inverse permutating circuit, a node message storing circuit. During coding, a posterior probability message in the posterior probability storing circuit may be permutated by the permutating circuit, and then check node messages may be updated in the message updating circuit and permutated by the inverse permutating circuit to get the updated check node messages.

LDPC codes may be classified into several types according to their construction, one of which is based on Euclidean Geometry (EG) and Projective Geometry (PG) over finite fields, collectively referred to as Finite Geometry (FG) codes. These codes are known to have excellent error correction performance and relatively large minimum distances. However, the EG-LDPC codes have higher row weight and column weight, so that it is not conducive to be implemented using the coding architecture shown in FIG. 6 or using algorithms such as method of successive algorithm (MSA). At present, the coding of Euclidean Geometry Low Density Parity Check (EG-LDPC) codes mainly relates to the improvement on algorithm, and the improvement on decoder architecture is generally uncommon. How to improve the decoder architecture to improve the throughput and reduce the resource utilization has become an urgent problem to be solved.

Figure 7:
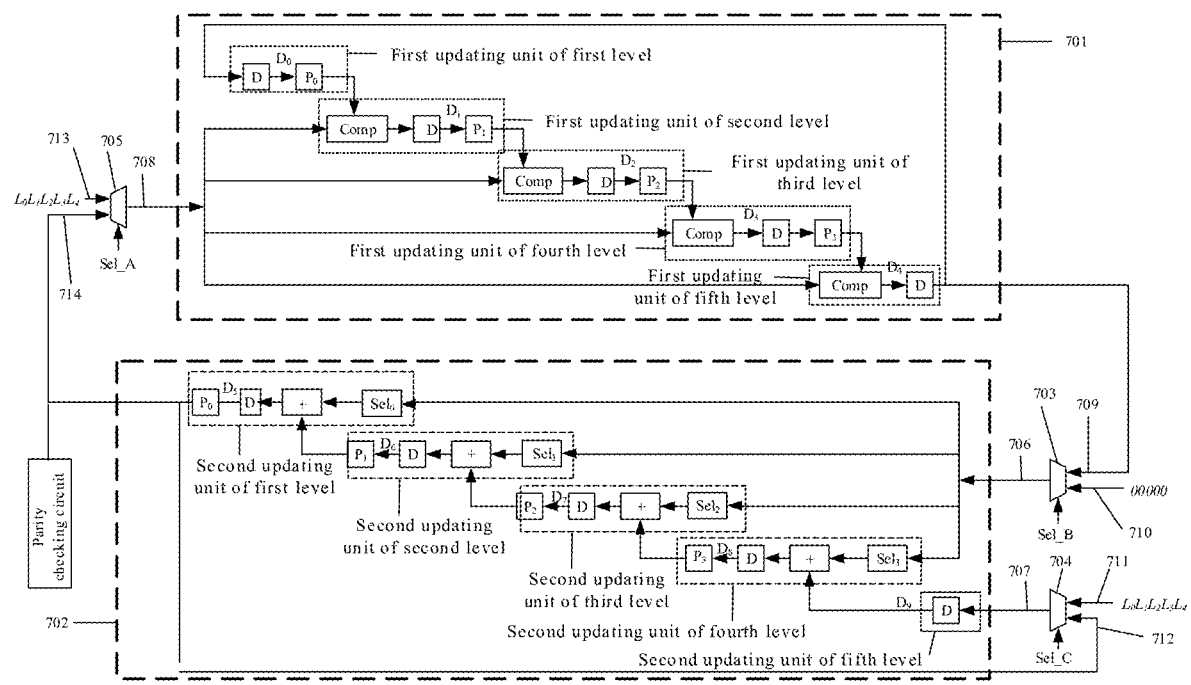
FIG. 7 is a schematic structural diagram of a decoder according to an example of the present disclosure.

Based on one or more of the above problems, a decoder is provided by an implementation of present disclosure, as shown in FIG. 7. A check matrix corresponding to a frame of code words comprises $\alpha*\alpha$ sub-matrices, a plurality of sub-matrices located in the same row in the check matrix constitute a layer of the check matrix, and a plurality of sub-matrices located in the same column constitute a column of the check matrix, the decoder comprising:

a check node updating circuit 701 that comprises first updating units of $\alpha$ levels, wherein the first updating unit of each level is connected sequentially; and a variable node updating circuit 702 that is connected with the check node updating circuit 701, the variable node updating circuit 702 comprises second updating units of α levels, wherein the second updating unit of each level is connected sequentially; wherein, in a first time period, the check node updating circuit 701 is configured to cause: the first updating unit of each level except the first updating unit of a first level sequentially receive variable node messages corresponding to each column of the check matrix, and sequentially calculate the received variable node messages with messages in the first updating unit of a previous level, to obtain the check node messages corresponding to different layers of the check matrix in the first updating units of different levels in the first updating units of α levels;

in the first time period, the variable node updating circuit 702 is configured to cause: the second updating unit of the α-th level sequentially receive the variable node messages corresponding to each column of the check matrix, and the second updating unit of each level except the second updating unit of the α-th level sequentially receive the messages of the second updating unit of a next level and performing calculation, to obtain corresponding intermediate calculation values in the second updating units of different levels in the second updating units of a levels; and in a second time period after the first time period, the variable node updating circuit 702 is configured to cause: the second updating unit of each level except the second updating unit of the α-th level sequentially receive the check node messages corresponding to each layer of the check matrix, and sequentially calculate the received check node messages with the intermediate calculation values of the second updating unit of the next level, to obtain the variable node messages corresponding to different columns of the check matrix in the second updating units of different levels in the second updating units of α levels.

In some specific examples, the first updating unit of each level is connected with both the first updating unit of a previous level and the first updating unit of a next level, and the first updating unit of α-th level is connected with the first updating unit of the first level; the second updating unit of each level of the variable node updating circuit 702 is connected with both the second updating unit of a previous level and the second updating unit of a next level, and the second updating unit of α-th level is connected with the second updating unit of the first level.

Here, a and n below are positive integers greater than zero.

Table 1 exemplarily illustrates a check matrix. The following is explained by taking the check matrix in Table 1 as an example. The check matrix shown in Table 1 includes 5*5 sub-matrices. A plurality of sub-matrices located in the same row in the check matrix constitute a layer of the check matrix, with a total of 5 layers; and a plurality of sub-matrices located in the same column constitute a column of the check matrix, with a total of 5 columns. $B_i$ represents a circulated permutation matrix, and the value of i corresponds to the number of columns in which non-zero elements are located in the first row of the circulated permutation matrix, wherein −1 represents an all-zero matrix. Here, the variable node messages corresponding to the first column to the fifth column of the check matrix are sequentially I), $L_1$, $L_2$, $L_3$, $L_4$, and the check node messages corresponding to the first layer to the fifth layer of the check matrix are sequentially $C_0$, $C_1$, $C_2$, $C_3$, $C_4$.

TABLE 1

$$\hat{H} = \begin{bmatrix} -1 & B_0 & B_1 & B_2 & B_3 \\ B_3 & -1 & B_0 & B_1 & B_2 \\ B_2 & B_3 & -1 & B_0 & B_1 \\ B_1 & B_2 & B_3 & -1 & B_0 \\ B_0 & B_1 & B_2 & B_3 & -1 \end{bmatrix}$$

Taking the check matrix illustrated in Table 1 as an example below, the operations of the decoder of the above implementation during a first iteration will be described.

In the case where the check matrix includes 5*5 sub-matrices, the check node updating circuit 701 of the decoder includes first updating units of 5 levels, and the variable node updating circuit 702 includes second updating units of 5 levels. The first time period includes five first sub-time periods, and the second time period includes five second sub-time periods. The duration of each of the five first sub-time periods is equal, and the duration of each of the five second sub-time periods is equal, wherein the duration of the first sub-time period is equal to that of the second sub-time period.

It should be noted that the number of levels of the check matrix and the corresponding first updating unit and the second updating unit listed herein is only an example and is not intended to limit the number of levels of the check matrix and the first updating unit and the second updating unit in the implementations of the present disclosure.

In the j-th first sub-time period, the first updating units of the second to fifth levels receive an initial channel message $L_{j-1}$, and compare it with the message of the first updating unit of the previous level in the previous time period to obtain the minimum value, so that the intermediate calculation value is obtained. In the next first sub-time period, the value obtained after permutating the intermediate calculation value of the first updating unit of the previous level is passed to the first updating unit of the next level and participates in the calculation of the first updating unit of the next level, to obtain the intermediate calculation value of the first updating unit of the next level in the next sub-time period. After five first sub-time periods, the check node message corresponding to the fifth layer of the check matrix is obtained in the first updating unit of the first level, the check node message corresponding to the fourth layer of the check matrix is obtained in the first updating unit of the second level, the check node message corresponding to the third layer of the check matrix is obtained in the first updating unit of the third level, the check node message corresponding to the second layer of the check matrix is obtained in the first updating unit of the fourth level, and the check node message corresponding to the first layer of the check matrix is obtained in the first updating unit of the fifth level.

In the j-th first sub-time period, the second updating unit of the fifth level receives the initial channel message $L_{j-1}$, and in the next first sub-time period, the intermediate calculation value in the second updating unit of the next level is passed to the second updating unit of the previous level and participates in the calculation of the second updating unit of the previous level, to obtain the intermediate calculation value of the second updating unit of the previous level in the next first sub-time period. In the j-th first sub-time period, the second updating units of the first to fourth levels receive the all-zero message, and compute it with the message passed by the second updating unit of the next level.

In the j-th second sub-time period, the second updating unit of the fifth level receives the message after being permutated of the second updating unit of the first level, and the second updating unit of each level in the second updating units of the first to fourth levels receives the message of the second updating unit of the next level and the message passed by the first updating unit of the fifth level, and calculate both messages. After five second sub-time periods, the variable node message corresponding to the fifth column of the check matrix is obtained in the second updating unit of the first level, the variable node message corresponding to the fourth column of the check matrix is obtained in the second updating unit of the second level, the variable node message corresponding to the third column of the check matrix is obtained in the second updating unit of the third level, the variable node message corresponding to the second column of the check matrix is obtained in the second updating unit of the fourth level, and the variable node message corresponding to the first column of the check matrix is obtained in the second updating unit of the fifth level.

In some implementations, the decoder further comprises: a first selector 703 comprising a first input 709, a second input 710 and a first output 706, the first input 709 is connected with the first updating unit of the $\alpha$-th level, the second input 710 is used for receiving all-zero messages, and the first output 706 is connected with each of the second updating units of the first to $\alpha$-1-th levels;

the first selector 703 is configured to: in a first time period, select a message at the second input 710 as an output message at the first output 706; in a second time period, select a message at the first input 709 as an output message at the first output 706.

In some implementations, the decoder further comprises: a second selector 704 comprising a third input 711, a fourth input 712 and a second output 707; the third input 711 is used for receiving variable node messages corresponding to each column of the check matrix, the fourth input 712 is connected with the second updating unit of the first level, and the second output 707 is connected with the second updating unit of the $\alpha$-th level;

the second selector 704 is configured to: in the first time period, select a message at the third input 711 as an output message at the second output 707; and in the second time period, select a message at the fourth input 712 as an output message at the second output 707.

In some implementations, the decoder further comprises: a third selector 705 comprising a fifth input 713, a sixth input 714 and a third output 708, the fifth input 713 is used for receiving initial channel messages corresponding to each column of the check matrix, the sixth input 714 is connected with the second updating unit of the first level, and the third output 708 is connected with each of the first updating units of the second to $\alpha$-th levels;

the third selector 705 is configured to: in a first time period of a first iteration, select a message at the fifth input 713 as an output message at the third output 708; and in a first time period of a next iteration, select a message at the sixth input 714 as an output message at the third output 708.

It can be understood that each iteration is divided into the first time period and the second time period. In the first iteration, the variable node messages received in the variable node updating circuit 702 and the check node updating circuit 701 are the initial channel messages ($L_0L_1L_2L_3L_4$), where $L_i$ is the initial channel message corresponding to the i-th layer of the check matrix. In the first iteration, in the first time period, the first selector 703 selects the all-zero message (00000) at the second input 710 as the output message at the first output 706, and the second selector 704 selects the message ($L_0L_1L_2L_3L_4$) at the third input 711 as the output message at the second output 707, and the third selector 705 selects the message ($L_0L_1L_2L_3L_4$) at the fifth input 713 as the output message at the third output 708. In the first iteration, in the second time period, the first selector 703 receives the message of the first updating unit of $\alpha$-th level in the check node updating circuit 701 as the output message at the first output 706, the second selector 704 receives the message of the second updating unit of the first level in the variable node updating circuit 702 as the output message at the second output 707, and the third output 708 of the third selector 705 does not output a message. The difference between the second iteration and the first iteration is that in the second iteration, in the first time period, the third selector 705 selects the message at the sixth input 714 as the output message at the third output 708, that is, the variable node message updated in the last iteration is selected as the output message at the third output 708.

In some implementations, the first updating unit of each level comprises a first delaying unit, and the first updating units of the first to $\alpha$-1-th levels also comprise a first shifting unit, the first updating units of the second to $\alpha$-th levels also each comprises a comparing unit; the first delaying unit is configured to delay outputting the messages updated in the first updating unit of each level, the first shifting unit is configured to shift the message updated in the first updating unit, and the comparing unit is used for comparing the message shifted in the first updating unit of the previous level with the received variable node message to obtain a minimum value.

Here, the comparing unit includes, but is not limited to, a comparator. The comparing unit may perform comparing to obtain the minimum value or sub-minimum value. The updating units of the first to fourth levels in the variable node updating circuit 702 may also include a selection unit for selecting a corresponding minimum value or sub-minimum value. In FIG. 7, the comparing unit is represented by comp and the selection units are represented by $sel_0$-$sel_3$.

In some implementations, the check node updating circuit 701 is configured to:

in the second time period, close the comparing unit in the first updating units of the second to $\alpha$-th levels.

It is understood that the comparing unit in the check node updating circuit 701 does not work in the second time period. That is, in the second time period, the values in the first updating unit of the previous level are not compared after being passed to the first updating unit of the next level.

In some implementations, the second updating unit of each level comprises a second delaying unit, and the second updating units of the first to $\alpha$-1-th levels also comprise an addition unit and a second shifting unit; the second delaying unit is configured to delay outputting the message updated in the second updating unit of each level, the second shifting unit is configured to shift the message updated in the second updating unit, and the addition unit is configured to add the message in the second updating unit of the next level and the received variable node message.

The addition unit herein includes, but is not limited to, an adder.

In FIG. 7, the addition unit is denoted by + and the first delaying unit and the second delaying unit are denoted by D.

In some implementations, the shift value of the first shifting unit in the first updating unit of the n-th level is equal to the shift value of the second shifting unit in the second updating unit of the n-th level; n is less than or equal to a.

In FIG. 7, $P_0$-$P_3$ represent the first shifting unit in the first updating units of the first to fourth levels, respectively, and $P_0$-$P_3$ represent the second shifting unit in the second updating units of the first to fourth levels, respectively.

Here, the first shifting unit of the first updating unit of the n-th level is represented by $P_{n-1}$ and the second shifting unit of the second updating unit of the n-th level is represented by $P_{n-1}$, wherein n−1 represents the shift value of the shifting unit. The shift value of the first shifting unit of the first updating unit of the n-th level is equal to the shift value of the second shifting unit of the second updating unit of the n-th level.

In some implementations, the delay duration of the first delaying unit of the first updating unit of each level is h1, and the delay duration of the second delaying unit of the second updating unit of each level is h2, and h1=h2.

In some specific examples, the delay duration of the first delaying unit is equal to the duration of the first sub-time period and the duration of the second sub-time period. The delay duration of the second delaying unit is equal to the duration of the first sub-time period and the duration of the second sub-time period, and the duration of the first sub-time period is equal to the duration of the second sub-time period.

In some specific examples, in the first iteration, and at the initial time before the first time period, the value after the first delaying unit in the check node updating circuit 701 is set to the maximum value and the value after the second delaying unit in the variable node updating circuit 702 is set to 0.

The situations about the intermediate computation values in the first updating unit of each level and the second updating unit of each level in the first iteration of coding will be described in detail below.

In the first one of the first sub-time periods of the first iteration, the initial channel message $L_0$ is passed into the first updating units of the second to fifth levels in the check node updating circuit 701 through the third output 708 of the third selector 705. In the first updating unit of each level in the first updating units of the second to fifth levels, $L_0$, after being compared with the value after the respective first delaying unit (the maximum value initially set), respectively, is temporarily donated as D. At the same time, in the first one of the first sub-time periods of the first iteration, the initial channel message $L_4$ is passed into the second updating unit of the fifth level in the variable node updating circuit 702 through the second output 707 of the second selector 704, and the all-zero message at the second input 710 of the first selector 703 is passed into the second updating units of the first to fourth levels through the first output 706 and is added to the value (initially set to 0) after the second delaying unit in the second updating units of the first to fourth levels. In the second one of the first sub-time periods to the fifth one of the first sub-time periods, the initial channel messages $L_{m-1}$ is passed into the check node updating circuit 701 sequentially, and be compared with the value obtained after the intermediate calculation value updated in the last first sub-time period in the first updating unit of the previous level is permutated, to obtain the updated intermediate calculation value in the second updating unit of each level. At the same time, the initial channel message $L_{m-1}$ is passed into the variable node updating circuit 702 and is added to 0.

The values after the first delaying unit in the first updating units of the first to fifth levels are denoted as $D_0$-$D_4$, respectively, and the values after in the second delaying unit in the second updating units of the first to fifth levels are denoted as $D_1$-$D_9$, respectively. Taking $D_4$ in the fifth one of the first sub-time periods as an example for illustration, in the first one of the first sub-time periods, $L_0$ is passed into the check node updating circuit 701, and L0 is obtained after being compared with the maximum value Max, $D_i$=$L_0$ (0<i<5), $D_0$=Max. In the second one of the first sub-time periods, L1 is passed in to the check node updating circuit 701, and after being compared with value of $D_0$ by the permutation matrix $P_0$, $D_1$=min($L_1$Max$^0$) is obtained, wherein the upper 0 indicates the permutation unit identification. In the third one of the first sub-time periods, $L_2$ is passed into the check node updating circuit 701, and after being compared with the value of $D_1$ by the permutation unit $P_1$, $D_2$=min($L_2L_1^1$) is obtained. In the fourth one of the first sub-time periods. $L_3$ is passed into the check node updating circuit 701, and after being compared with the value of $D_2$ by the permutation unit $P_2$, $D_3$=min($L_3(L_2L_1^1)^2$) is obtained. In the fifth one of the first sub-time periods. $L_4$ is passed into the check node updating circuit 701, and after being compared with the value of $D_3$ by the permutation unit $P_3$, $D_4$=min($L_4L_3(L_2L_1^1)^2)^3$) is obtained. Similarly, the values in other first updating units in the fifth one of the first sub-time periods may be derived. Table 2 shows the values of $D_i$ corresponding to the initial period, the first one of the first sub-time periods to the fifth one of the first sub time-periods.

TABLE 2

| Time period | Initial time period | The first one of the first sub-time periods | The second one of the first sub-time period | The third one of the first sub-time periods | The fourth one of the first sub-time periods | The fifth one of the first sub-time periods |
| --- | --- | --- | --- | --- | --- | --- |
| $D_0$ | Max | Max | min($L_1L_0^3$) | min($L_1L_0^3$) | min($L_2(L_1L_0^2)^3$) | min($L_3(L_2(L_1L_0^1)^2)^3$) |
| $D_1$ | Max | min($L_0$Max$^0$) | min($L_1$Max$^0$) | min($L_2L_0^0$) | min($L_3(L_1L_0^3)^0$) | min($L_4(L_2(L_1L_0^2)^3)^0$) |
| $D_2$ | Max | min($L_0$Max$^1$) | min($L_1L_0^1$) | min($L_2L_1^1$) | min($L_3(L_2L_0^0)^1$) | min($L_4(L_3(L_1L_0^3)^0)^1$) |
| $D_3$ | Max | min($L_0$Max$^2$) | min($L_1L_0^2$) | min($L_2(L_1L_0^1)^2$) | min($L_3(L_2L_1^1)^2$) | min($L_4(L_3(L_2L_0^0)^1)^2$) |
| $D_4$ | Max | min($L_0$Max$^3$) | min($L_1L_0^3$) | min($L_2(L_1L_0^2)^3$) | min($L_3(L_2(L_1L_0^1)^2)^3$) | min($L_4(L_3(L_2L_1^1)^2)^3$) |

After the fifth one of the first sub-time periods, the first updating unit of each level in the check node updating circuit 701 completes the minimization and comparison processes corresponding to a layer of the check matrix, to obtain the updated check node message in each layer of the check matrix. In the next second time period, the check node updating circuit 701 only transmits the updated check node message obtained in the first updating unit of each level, after being permutated by the permutation unit, to the variable node updating circuit 702 to participate in the calculation.

The specific shift in $P_i$ is analyzed below with Table 2 and taking the fifth one of the first sub-time periods as an example for analyzing. In the fifth one of the first sub-time periods, the value corresponding to $D_4$ is $D_4=\min(L_4(L_3(L_2L_1^1)^2)^3)$. The variable node message corresponding to the first column of the check matrix is $L_0$, wherein $L_0$ does not exist in $D_4$. It can be seen from the check matrix that $D_4$ is the check node message of the first layer (the first column block of the first layer is 0); the check node message corresponding to the second column block $B_0$ of the first layer is $L_i$, and after passing $P_1$ in $D_4$, $(L_1^1)$ is obtained; the check node message corresponding to the third column block $B_0$ is $L_2$, and by being compared with $(L_1^1)$, min $(L_2L_1^1)$ is obtained, thus at this time, the message sequence $B_0$ in the second column block needs to be converted into message sequence $B_1$ in the third column block. The size of the small matrix in this example is 3*3, so the shift value of $B_1$ is $r(P_1)=(r(B_0)-r(B_1)+3)$, wherein $r(P_1)$ is the shift value of $P_1$, and 3 is the rank of the small matrix. The check node message corresponding to the fourth column block $B_2$ is $L_3$, and by being compare with $((L_2L_1^1)^2)$, $\min(L_3(L_2L_1^1)^2)$ is obtained, at this time the message sequence $B_1$ in the third column block needs to be converted into message sequence $B_2$ in the fourth column block, and thus the shift value of $P_2$ is $r(P_2)=(r(B_1)-r(B_2)+3)$; and so on, the shift value of $P_x$ is $r(P_x)=(r(B_{x-1})-r(B_x)+3)$.

Based on the check node message is the message sequence of $B_3$ obtained as described above. i.e. the message sequence of the last column, the second layer of the check matrix is then taken into account, which is the message value of $D_3$ at the fifth one of the first sub-time periods. At this time, the sequence is that of $B_2$, and the sequence is changed into $B_3$ after being permutated by $P_3$ in the sixth second sub-time period and is passed into the variable node updating circuit 702. The remaining layers likewise become sequence B3 after several permutations and are passed into the variable node update circuit 702. At the same time, it should also be noted that during the first one to the fifth one of the second sub-time periods, the check node updating circuit 701 outputs only the calculated check node messages in sequence. In order to prevent the comparing unit from comparing the message corresponding to the following layers with the message passing through the first selector 703 again to get wrong result when outputting the check node message corresponding to the previous layers, the comparing unit be suspended at this time should and directly pass the permutated data to the first updating unit of the next level.

Next, the values corresponding to $D_i$ in the variable node updating circuit 702 are described in detail. The message obtained in the check node updating circuit 701 is denoted as $C_i$ (i is the number of layers):

In the first one of the first sub-time periods, the output of the first selector 703 is 0, and the output of the second selector 704 is $L_0$, at this time $D_i=0(4\leq i<9)$, $D_9=L_0$. In the second one of the first sub-time periods, the output of the first selector 703 is 0, and the output of the second selector 704 is $L_1$, at this time $D_i=0(4\leq i<8)$, $D_8=L_0$, $D_9=L_1$. In the third one of the first sub-time periods, the output of the first selector 703 is 0, and the output of the second selector 704 is $L_2$, at this time $D_i=0(4\leq i<7)$, $D_7=L_0^3$, $D_8=L_1$, $D_9=L_2$. In the fourth one of the first sub-time periods, the output of the first selector 703 is 0, and the output of the second selector 704 is $L_3$, at this time $D_i=0(4\leq i<6)$, $D_6=L_0^{32}$, $D_7=L_1^3$, $D_8=L_2$, $D_9=L_3$. In the fifth one of the first sub-time periods, the output of the first selector 703 is 0, and the output of the second selector 704 is $L_4$, at this time $D_5=L_0^{321}$, $D_6=L_1^{32}$, $D_7=L_2^3$, $D_8=L^3$, $D_9=L_4$.

In the first one of the second sub-time periods, the updated check node message C0 (i.e., $\min(L_4((L_3(L_2L_1^1)^2)^3))$) corresponding to the first layer of the check matrix in the first updating unit of the fifth level is passed directly into the second updating units of the first to fourth levels of the variable node updating circuit 702, and then is added to the value obtained with the intermediate calculation value updated in the previous sub-time period in the second updating unit of the next level in the variable node updating circuit 702 after being permutated. In the second one to the fifth one of the second sub-time periods, the check node messages of the second to fifth layers of the check matrix updated in the first updating units of the first to the fourth levels pass through the comparing unit (closed in the second time period) and the permutation unit, then into second updating unit of the first to fourth levels of the variable node updating unit sequentially, and are added to the value obtained with the intermediate calculation value updated in the previous sub-time period in the second updating unit of the next level in the variable node updating circuit 702 after being permutated.

Next, the values corresponding to $D_i$ in the first one to the fifth one of the second sub-time periods in the variable node updating circuit 702 are described in detail. The message obtained in the check node updating circuit 701 is denoted as $C_i$ (i is the number of layers), taking $D_5$ in the fifth one of the second sub-time periods as an example:

In the first one of the second sub-time periods, $C_0$ is passed into the variable node updating circuit 702, and is added to the value of $D_i(5\leq i\leq 9)$, at this time $D_i=D_{i+1}+C_0$ ($5\leq i<9$) $D_9=L_0^{3210}$. In the second one of the second sub-time periods, $C_1$ is passed into the variable node updating circuit 702, and is added to the value of $D_9$, to get $D_8=C_1+L_0^{3210}$. In the third one of the second sub-time periods, $C_2$ is passed into the variable node updating circuit 702, and is added to the value of $D_8$, to get $D_7=C_2+(C_1+L_0^{3210})^3$. In the fourth one of the second sub-time periods, $C_3$ is passed into the variable node updating circuit 702, and is added to the value of $D_7$, to get $D_6=C_3+(C_2+(C_1+L_0^{3210})^3)^2$. In the fifth one of the second sub-time periods, $C_4$ is passed into the variable node updating circuit 702, and is added to the value of $D_6$, to get $D_5=C_4+(C_3+(C_2+(C_1+L_0^{3210})^3)^2)^1$.

Table 3 shows the values of corresponding $D_i$ in the first one of the second sub-time periods to the fifth one of the second sub-time periods.

TABLE 3

| Time period | The fifth one of the first sub-time periods | The first one of the second sub-time periods | The second one of the second sub-time periods | The third one of the second sub-time periods |
|---|---|---|---|---|
| $D_5$ | $L_0^{321}$ | $C_0 + (L_1^{32})^1$ | $C_1 + (C_0 + (L_2^3)^2)^1$ | $C_2 + (C_1 + (C_0 + L_3^3)^2)^1$ |
| $D_6$ | $L_1^{32}$ | $C_0 + (L_2^3)^2$ | $C_1 + (C_0 + L_3^3)^2$ | $C_2 + (C_1 + (C_0 + L_4)^3)^2$ |
| $D_7$ | $L_2^3$ | $C_0 + L_3^3$ | $C_1 + (C_0 + L_4)^3$ | $C_2 + (C_1 + L_0^{3210})^3$ |

TABLE 3-continued

| | | | | |
|---|---|---|---|---|
| $D_8$ | $L_3$ | $C_0 + L_4$ | $C_1 + L_0^{3210}$ | $C_2 + (C_0 + (L_1^{32})^1)^0$ |
| $D_9$ | $L_4$ | $L_0^{3210}$ | $(C_0 + (L_1^{32})^1)^0$ | $(C_1 + (C_0 + (L_2^3)^2)^1)^0$ |
| Time period | The fourth one of the second sub-time periods | | The fifth one of the second sub-time periods | |
| $D_5$ | $C_3 + (C_2 + (C_1 + (C_0 + L_4)^3)^2)^1$ | | $C_4 + (C_3 + (C_2 + (C_1 + L_0^{3210})^3)^2)^1$ | |
| $D_6$ | $C_3 + (C_2 + (C_1 + L_0^{3210})^3)^2$ | | $C_4 + (C_3 + (C_2 + (C_0 + (L_1^{32})^1)^0)^3)^2$ | |
| $D_7$ | $C_3 + (C_2 + (C_0 + (L_1^{32})^1)^0)^3$ | | $C_4 + (C_3 + (C_1 + (C_0 + (L_2^3)^2)^1)^0)^3$ | |
| $D_8$ | $C_3 + (C_1 + (C_0 + (L_2^3)^2)^1)^0$ | | $C_4 + (C_2 + C_1 + (C_0 + (L_3^3)^2)^1)^0$ | |
| $D_9$ | $(C_2 + C_1 + (C_0 + (L_3^3)^2)^1)^0$ | | $(C_3 + (C_2 + (C_1 + (C_0 + L_4)^3)^2)^1)^0$ | |

Similarly, the specific shift value in the variable node updating circuit 702 is analyzed, the principle of which is substantially the same as that in the check node updating circuit 701. Also, taking the $D_9$ in the fifth one of the second sub-time periods as an example for brief illustration, at this time, $D_9=(C_3+(C_2+(C^1+(C_0+L_4)^3)^2)^1)^0$. The first layer check node message ($C_0$) passed from the check node updating circuit 701 is accumulated with the corresponding initial channel message ($L_4$), and then after passing $P_3$, accumulated with the check node message ($C_1$) of next layer. Here, the sequence of the check node message passed from the check node updating circuit 701 is the sequence of $B_3$, but the sequence of the second layer is $B_2$. When accumulated, ($C_0+L_4$) needs to be changed into the sequence of $B_2$ by passing $P_3$, and then accumulated with $C_1$, thus $r(P_3)=(r(B_2)-r(B_3)+3)$, which is consistent with the shift value in the check node updating circuit 701.

In some implementations, the decoder further comprises a parity check circuit connected with the variable node updating circuit 702;

the parity check circuit is configured to: receive the variable node messages of the variable node updating circuit 702, and substitute the received variable node message into check equations for checking, if all the check equations are fulfilled, it is determined that the coding is successful; otherwise if not all the check equations are fulfilled, it is determined that the coding fails, and a next iteration is needed to update the check node messages and the variable node messages until the coding is successful or a maximum iteration count is reached.

Here, the parity check circuit may specifically be connected to the second delaying unit in the second updating unit of the first level in the variable node updating circuit 702.

It can be understood that after five first sub-time periods and five second sub-time periods, updating of the check node messages and the variable node messages are completed once. The outputs in the variable node updating circuit 702 will be divided into two paths, one for hard decision to check whether the coding is successful, and the other is output to the check node updating circuit 701 for the next iterative coding. In another iteration, the third output 708 of the third selector 705 selects the message of the sixth input 714 to input into the check node updating circuit 701, and the rest operations remain unchanged until the whole coding is completed.

It can be understood that the implementations of the present disclosure provide a new architecture of the decoder, which utilizes the first shifting unit, the second shifting unit, a first delaying unit, a second delaying unit, a comparing unit and an addition unit in different first updating unit and second updating unit to adjust the duration of the first delaying unit and the second delaying unit by using a simple shift delay function to update the information.

In the implementations of the present disclosure, the check node messages corresponding to each layer of the check matrix are updated by using the first updating units of $\alpha$ levels in the first time period, and the variable node messages corresponding to each column of the check matrix are updated by the second updating units of $\alpha$ levels in the first time period and the second time period, which can increase throughput and reduce resource utilization.

Based on the above-described decoder, the examples of the present disclosure also provide a memory controller, which include the decoder according to any one of above examples.

Based on the above-described memory controller, the examples of the present disclosure also provide a memory system, which includes the memory controller of the above examples and a memory device coupled to the memory controller.

Figure 8:
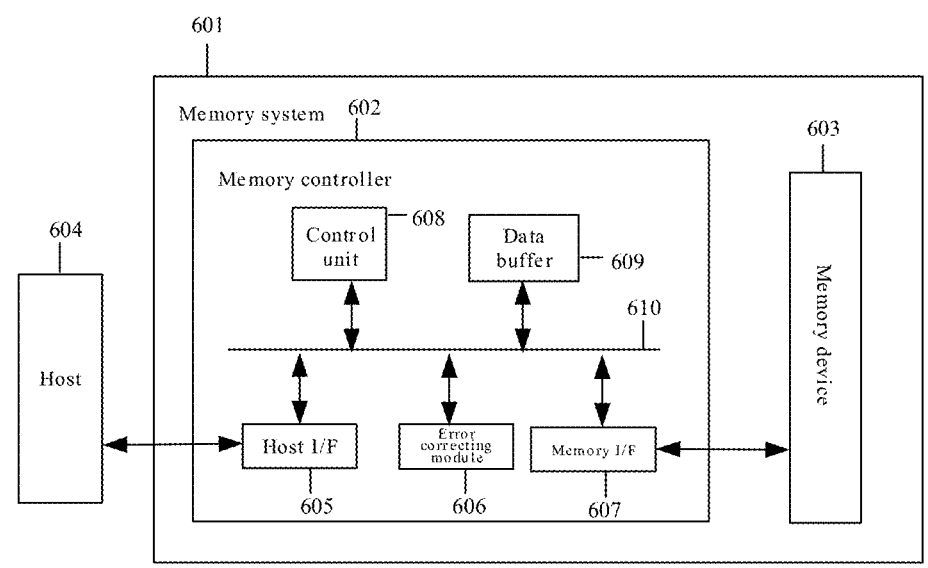
FIG. 8 is a schematic diagram of a memory system according to an example of the present disclosure.

FIG. 8 illustrates a block diagram of a memory system 601 comprising a memory controller 602 and a memory device 603. The memory controller 602 controls the memory device 603 to perform read and write operations. Here, the memory controller 602 may be coupled in any way to the memory device 603. The memory controller 602 includes a control unit (e.g. central processing unit) 608, a data buffer 609, an error correction module 606, a host I/F 605, and a memory I/F 607. The memory device 603 in the examples of the present disclosure may be semiconductor memory for storing data in a non-volatile way, such as a NAND memory. The memory system 601 is connected to a host 604. The host I/F 605 outputs command received from the host 604, valid data (write data) and so on to the internal bus 610, and transmits the valid data (read data) read from the memory device 603, the response from the control unit 608 to the host 604.

The control unit 608 may instruct the memory I/F 607 to write the valid data and the parity data, check matrix to the memory device 603 according to the command from the host 604. In addition, the control unit may instruct the memory I/F 607 to read the valid data and the parity data, check matrix from the memory device according to the command from the host 604.

The error correction module 606 herein includes an encoding unit and a decoding unit. The encoding unit encodes the written valid data of a predetermined size to generate parity data (e.g., a low density parity check code) and the corresponding parity check matrix. The parity check data and the corresponding parity check matrix generated by the encoding unit may be stored in the memory device. The decoding unit performs decoding by using the parity check data and the corresponding parity check matrix. The decoding unit herein includes the decoder. The parity check code and the corresponding parity check matrix used in coding may be obtained from the memory device.

Based on the above-described memory system, the examples of present disclosure also provide an electronic device, which includes the decoder according to any one of the above examples and a memory device coupled to the decoder.

The decoder may be built into the memory controller, or may be not built into the memory controller and but provided outside the memory controller.

The specific structure and composition of the memory controller, memory system, electronic device may be referred to the foregoing detailed description of FIG. 1, FIG. 2A, FIG. 2B, FIG. 3A, FIG. 3B, FIG. 4 and FIG. 5, which is not repeated for the sake of brevity.

Figure 9:
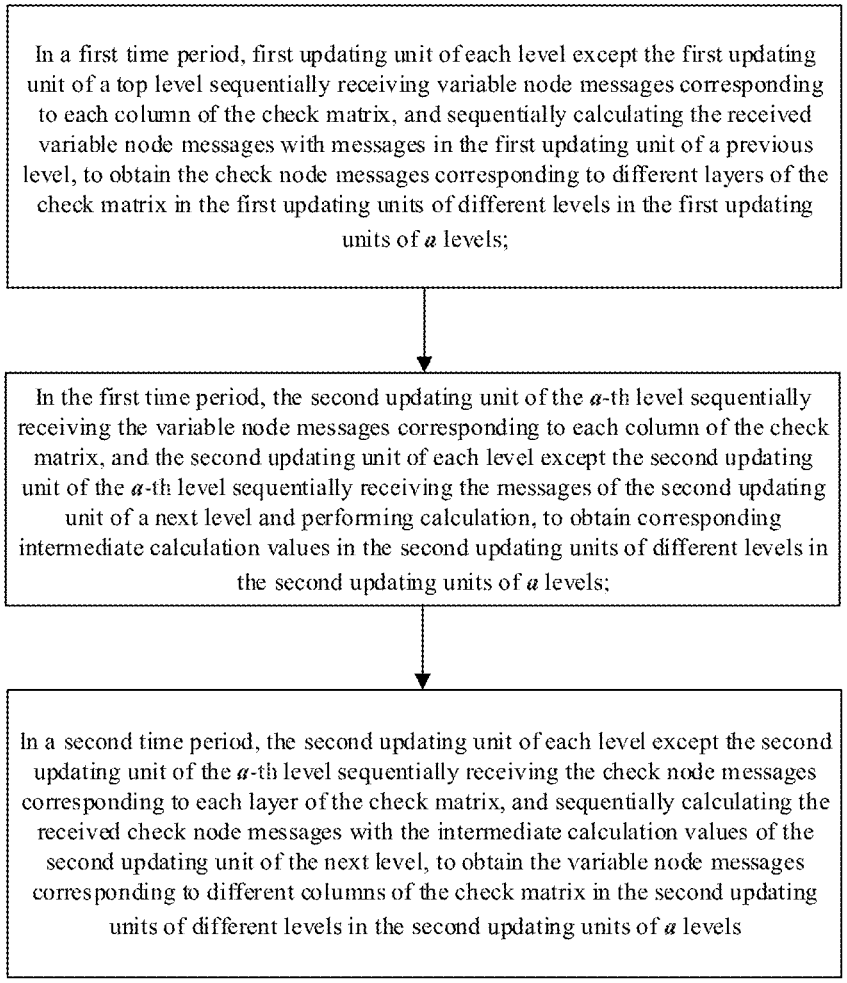
FIG. 9 is a schematic flow diagram of implementation of a coding method according to an example of the present disclosure.

Based on the above-described decoder, the examples of present disclosure also provide a coding method, wherein during coding a frame of code words with a check matrix including $\alpha*\alpha$ sub-matrices, a plurality of sub-matrices located in the same row in the check matrix constitute a layer of the check matrix, and a plurality of sub-matrices located in the same column constitute a column of the check matrix, as shown in FIG. 9, the method comprising:

in a first time period, first updating unit of each level except the first updating unit of a first level sequentially receiving variable node messages corresponding to each column of the check matrix, and sequentially calculating the received variable node messages with messages in the first updating unit of a previous level, to obtain the check node messages corresponding to different layers of the check matrix in the first updating units of different levels in the first updating units of $\alpha$ levels;

in the first time period, the second updating unit of the $\alpha$-th level sequentially receiving the variable node messages corresponding to each column of the check matrix, and the second updating unit of each level except the second updating unit of the $\alpha$-th level sequentially receiving the messages of the second updating unit of a next level and performing calculation, to obtain corresponding intermediate calculation values in the second updating units of different levels in the second updating units of $\alpha$ levels:

in a second time period, the second updating unit of each level except the second updating unit of the $\alpha$-th level sequentially receiving the check node messages corresponding to each layer of the check matrix, and sequentially calculating the received check node messages with the intermediate calculation values of the second updating unit of the next level, to obtain the variable node messages corresponding to different columns of the check matrix in the second updating units of different levels in the second updating units of $\alpha$ levels.

In some implementations, the first updating unit of each level comprises a first delaying unit, and the first updating unit of the first level to $\alpha$-1-th level also each comprises a first shifting unit, the first updating unit of a second level to $\alpha$-th level also each comprises a comparing unit;

the method comprises: the first delaying unit delaying outputting of the messages updated in the first updating unit of each level, the first shifting unit shifting the messages updated in the first updating unit, and the comparing unit comparing the messages shifted in the first updating unit of the previous level with the received variable node messages to obtain a minimum value.

In some implementations, the method further comprises: in the second time period, closing the comparing unit in the first updating unit of the second level to $\alpha$-th level.

In some implementations, the second updating unit of each level each comprises a second delaying unit, and the second updating unit of the first level to $\alpha$-1-th level also each comprises an addition unit and a second shifting unit
the method further comprises: the second delaying unit delaying outputting of the messages updated in the second updating unit of each level, the second shifting unit shifting the messages updated in the second updating units, and the addition unit adding the messages in the second updating unit of the next level and the received variable node messages.

In some implementations, the decoder further comprises: a first selector comprising a first input, a second input and a first output, the first input is connected with the first updating unit of the $\alpha$-th level, the second input is configured to receive all-zero messages, and the first output is connected with each of the second updating unit of the first level to $\alpha$-1-th level;

the method further comprises: in the first time period, selecting a message at the second input as an output message at the first output; and in the second time period, selecting a message at the first input as an output message at the first output.

In some implementations, the decoder further comprises: a second selector comprising a third input, a fourth input and a second output, the third input is configured to receiving the variable node messages corresponding to each column of the check matrix, the fourth input is connected with the second updating unit of the first level, and the second output is connected with the second updating unit of the $\alpha$-th level;

the method further comprises: in the first time period, selecting a message at the third input as an output message at the second output; and in the second time period, selecting a message at the fourth input as an output message at the second output.

In some implementations, the decoder further comprises a parity check circuit connected with the variable node updating circuit;

the method further comprises: receiving the variable node messages of the variable node updating circuit, and substituting the received variable node messages into check equations for checking, if all the check equations are fulfilled, it is determined that the coding is successful; otherwise if not all the check equations are fulfilled, it is determined that the coding fails, and a next iteration is needed to update the check node messages and the variable node messages until the coding is successful or a maximum iteration count is reached.

In some implementations, the decoder further comprises: a third selector comprising a fifth input, a sixth input and a third output, the fifth input is configured to receiving initial channel messages corresponding to each column of the check matrix, the sixth input is connected with the second updating unit of the first level, and the third output is connected with each of the first updating units of the second level to $\alpha$-th level;

the method further comprises: in the first time period, selecting a message at a fifth input as an output message at a third output;

in a next iteration, selecting the message at the sixth input as an output message at the third output.

Figure 10:
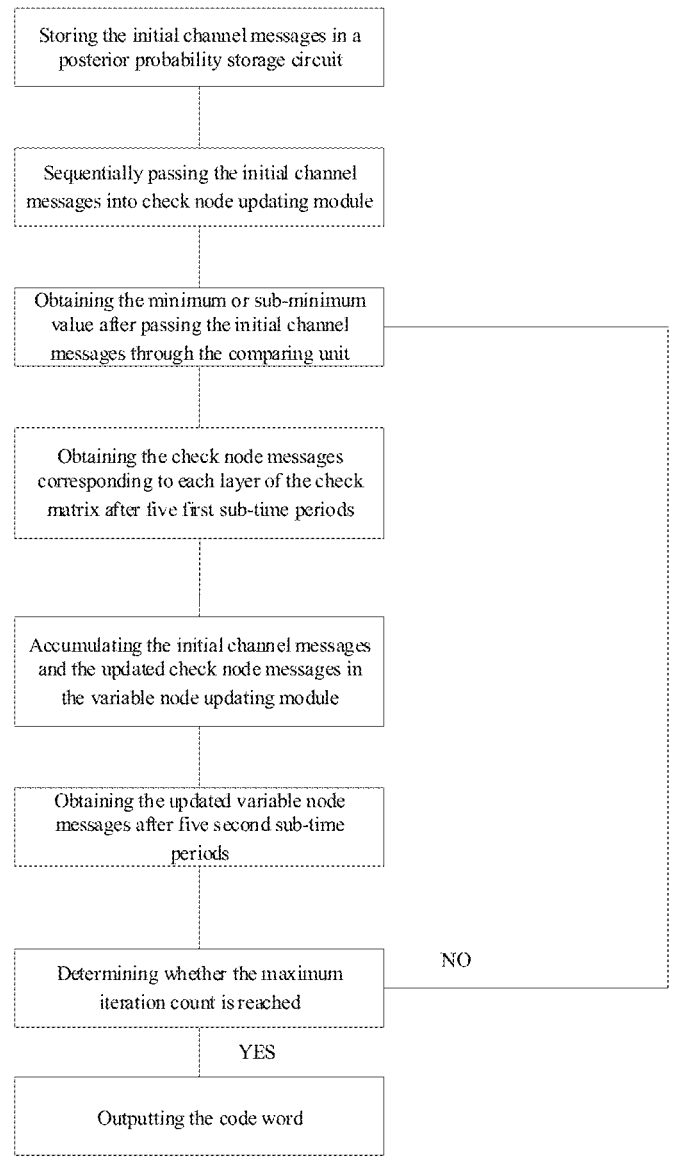
FIG. 10 is a schematic flow diagram of framework of a coding method according to an example of the present disclosure.

FIG. 10 is a schematic flow diagram of framework of a coding method according to an example of the present disclosure. The coding method of the example of the present disclosure will be further introduced in conjunction with FIG. 10.

In the first iteration, the initial channel messages are stored in a posterior probability storing circuit, and the check node updating circuit receives the initial channel messages $L_0$, $L_1$, $L_2$, $L_3$, $L_4$ sequentially in the first time period. The minimum or sub-minimum value is obtained by passing the initial channel messages through the comparing unit. The updated check node messages corresponding to the first layer to the fifth layer of the check matrix after five first sub-time periods. In the variable node updating circuit, the variable node updating circuit accumulates the initial channel messages and the updated check node messages to obtain the updated variable node messages. The updated variable node messages are obtained after five second sub-time periods. After the variable node messages are updated, it is determined whether the maximum iteration count is reached. If the maximum iteration count is reached, output the code word; otherwise, carry out the next iteration.

The above coding method has been described in detail on the decoder side, which is not repeated for the sake of brevity.

It should be understood that references to "one example" or "an example" throughout the specification mean that particular features, structures or characteristics related to the examples are included in at least one example of the present disclosure. Thus, the phrases "in one example" or "in an example" appearing throughout the specification do not necessarily refer to the same example. In addition, these particular features, structures or characteristics may be combined arbitrarily in one or more examples. It should be understood that in various examples of the present disclosure, the sequence numbers of the above-mentioned processes do not mean that the sequence of execution, and the sequence of execution should be determined by their functions and inherent logic and should not constitute any limitation on the implementation of the examples of the present disclosure. The above sequence number of examples of that present disclosure are for description only and do not represent the advantages and disadvantages of the example.

The method disclosed in several examples provided in the present disclosure may be arbitrarily combined without conflict to get other example methods.

According to a first aspect of the examples of the present disclosure, a decoder is provided, wherein a check matrix corresponding to a frame of code words comprises a*a sub-matrices, a plurality of sub-matrices located in the same row in the check matrix constitute a layer of the check matrix, and a plurality of sub-matrices located in the same column constitute a column of the check matrix, wherein a is a positive integer greater than 0, the decoder comprises:
  a check node updating circuit that comprises first updating units of a levels, wherein the first updating unit of each level is connected sequentially; and
  a variable node updating circuit that is connected with the check node updating circuit, the variable node updating circuit comprises second updating units of a levels, wherein the second updating unit of each level is connected sequentially; wherein,
  in a first time period, the check node updating circuit is configured to cause: the first updating unit of each level except the first updating unit of a first level sequentially receive variable node messages corresponding to each column of the check matrix, and sequentially calculate the received variable node messages with messages in the first updating unit of a previous level, to obtain the check node messages corresponding to different layers of the check matrix in the first updating units of different levels in the first updating units of a levels;

in the first time period, the variable node updating circuit is configured to cause: the second updating unit of the a-th level sequentially receive the variable node messages corresponding to each column of the check matrix, and the second updating unit of each level except the second updating unit of the a-th level sequentially receive the messages of the second updating unit of a next level and performing calculation, to obtain corresponding intermediate calculation values in the second updating units of different levels in the second updating units of a levels; and
  in a second time period after the first time period, the variable node updating circuit is configured to cause: the second updating unit of each level except the second updating unit of the a-th level sequentially receive the check node messages corresponding to each layer of the check matrix, and sequentially calculate the received check node messages with the intermediate calculation values of the second updating unit of the next level, to obtain the variable node messages corresponding to different columns of the check matrix in the second updating units of different levels in the second updating units of a levels.

In some implementations, the first updating unit of each level comprises a first delaying unit, and the first updating unit of the first level to a-1-th level also each comprises a first shifting unit, the first updating unit of a second level to a-th level also each comprises a comparing unit; wherein the first delaying unit is configured to delay outputting of the messages updated in the first updating unit of each level, the first shifting unit is configured to shift the messages updated in the first updating unit, and the comparing unit is configured to compare the messages shifted in the first updating unit of the previous level with the received variable node messages to obtain a minimum value.

In some implementations, the check node updating circuit is configured to:
  in the second time period, close the comparing unit in the first updating unit of the second level to a-th level.

In some implementations, the second updating unit of each level each comprises a second delaying unit, and the second updating unit of the first level to a-1-th level also each comprises an addition unit and a second shifting unit; wherein the second delaying unit is configured to delay outputting of the messages updated in the second updating unit of each level, the second shifting unit is configured to shift the messages updated in the second updating units, and the addition unit is configured to add the messages in the second updating unit of the next level and the received variable node messages.

In some implementations, a shift value of the first shifting unit in the first updating unit of n-th level is equal to the shift value of the second shifting unit in the second updating unit of the n-th level; and wherein n is less than or equal to a.

In some implementations, a delay duration of the first delaying unit of the first updating unit of each level is h1, and the delay duration of the second delaying unit of the second updating unit of each level is h2, and wherein h1=h2.

In some implementations, the decoder further comprises: a first selector comprising a first input, a second input and a first output, the first input is connected with the first updating unit of the a-th level, the second input is configured to receive all-zero messages, and the first output is connected with each of the second updating unit of the first level to a-1-th level;
  the first selector is configured to:

in the first time period, select a message at the second input as an output message at the first output; and in the second time period, select a message at the first input as an output message at the first output.

In some implementations, the decoder further comprises: a second selector comprising a third input, a fourth input and a second output, the third input is configured to receiving the variable node messages corresponding to each column of the check matrix, the fourth input is connected with the second updating unit of the first level, and the second output is connected with the second updating unit of the a-th level;

the second selector is configured to:
in the first time period, select a message at the third input as an output message at the second output; and
in the second time period, select a message at the fourth input as an output message at the second output.

In some implementations, the decoder further comprises a parity check circuit connected with the variable node updating circuit;

the parity check circuit is configured to: receive the variable node messages of the variable node updating circuit, and substitute the received variable node messages into check equations for checking, if all the check equations are fulfilled, it is determined that the coding is successful; otherwise if not all the check equations are fulfilled, it is determined that the coding fails, and a next iteration is needed to update the check node messages and the variable node messages until the coding is successful or a maximum iteration count is reached.

In some implementations, the decoder further comprises: a third selector comprising a fifth input, a sixth input and a third output, the fifth input is configured to receiving initial channel messages corresponding to each column of the check matrix, the sixth input is connected with the second updating unit of the first level, and the third output is connected with each of the first updating units of the second level to a-th level;

the third selector is configured to:
in a first time period of a first iteration, select a message at the fifth input as an output message at the third output; and
in a first time period of a next iteration, select a message at the sixth input as an output message at the third output.

According to a second aspect of the examples of present disclosure, a memory controller is provided, which includes a decoder according to any one of above examples.

According to a third aspect of the examples of present disclosure, a memory system is provided, which includes a memory controller of above examples and a memory device coupled to the memory controller.

According to a fourth aspect of the examples of present disclosure, an electronic device is provided, which includes a decoder of any one of above examples and a memory device coupled to the decoder.

According to a fifth aspect of the examples of present disclosure, a coding method is provided, wherein during coding a frame of code words with a check matrix including a*a sub-matrices, a plurality of sub-matrices located in the same row in the check matrix constitute a layer of the check matrix, and a plurality of sub-matrices located in the same column constitute a column of the check matrix, the method comprising:

in a first time period, first updating unit of each level except the first updating unit of a first level sequentially receiving variable node messages corresponding to each column of the check matrix, and sequentially calculating the received variable node messages with messages in the first updating unit of a previous level, to obtain the check node messages corresponding to different layers of the check matrix in the first updating units of different levels in the first updating units of a levels;

in the first time period, the second updating unit of the α-th level sequentially receiving the variable node messages corresponding to each column of the check matrix, and the second updating unit of each level except the second updating unit of the a-th level sequentially receiving the messages of the second updating unit of a next level and performing calculation, to obtain corresponding intermediate calculation values in the second updating units of different levels in the second updating units of a levels;

in a second time period, the second updating unit of each level except the second updating unit of the a-th level sequentially receiving the check node messages corresponding to each layer of the check matrix, and sequentially calculating the received check node messages with the intermediate calculation values of the second updating unit of the next level, to obtain the variable node messages corresponding to different columns of the check matrix in the second updating units of different levels in the second updating units of a levels.

In some implementations, the first updating unit of each level comprises a first delaying unit, and the first updating unit of the first level to a-1-th level also each comprises a first shifting unit, the first updating unit of a second level to a-th level also each comprises a comparing unit;

the method comprises:
the first delaying unit delaying outputting of the messages updated in the first updating unit of each level, the first shifting unit shifting the messages updated in the first updating unit, and the comparing unit comparing the messages shifted in the first updating unit of the previous level with the received variable node messages to obtain a minimum value.

In some implementations, the method further comprises:
in the second time period, closing the comparing unit in the first updating unit of the second level to a-th level.

In some implementations, the second updating unit of each level each comprises a second delaying unit, and the second updating unit of the first level to a-1-th level also each comprises an addition unit and a second shifting unit;

the method further comprises:
the second delaying unit delaying outputting of the messages updated in the second updating unit of each level, the second shifting unit shifting the messages updated in the second updating units, and the addition unit adding the messages in the second updating unit of the next level and the received variable node messages.

In some implementations, a decoder further comprises: a first selector comprising a first input, a second input and a first output, the first input is connected with the first updating unit of the a-th level, the second input is configured to receive all-zero messages, and the first output is connected with each of the second updating unit of the first level to a-1-th level;

the method further comprises:
in the first time period, selecting a message at the second input as an output message at the first output; and
in the second time period, selecting a message at the first input as an output message at the first output.

In some implementations, a decoder further comprises: a second selector comprising a third input, a fourth input and a second output, the third input is configured to receiving the variable node messages corresponding to each column of the check matrix, the fourth input is connected with the second updating unit of the first level, and the second output is connected with the second updating unit of the a-th level;

the method further comprises:

in the first time period, selecting a message at the third input as an output message at the second output; and in the second time period, selecting a message at the fourth input as an output message at the second output.

In some implementations, a decoder further comprises a parity check circuit connected with the variable node updating circuit;

the method further comprises:

receiving the variable node messages of the variable node updating circuit, and substituting the received variable node messages into check equations for checking, if all the check equations are fulfilled, it is determined that the coding is successful; otherwise if not all the check equations are fulfilled, it is determined that the coding fails, and a next iteration is needed to update the check node messages and the variable node messages until the coding is successful or a maximum iteration count is reached.

In some implementations, the decoder further comprises: a third selector comprising a fifth input, a sixth input and a third output, the fifth input is configured to receiving initial channel messages corresponding to each column of the check matrix, the sixth input is connected with the second updating unit of the first level, and the third output is connected with each of the first updating units of the second level to a-th level:

the method further comprises:

in the first time period, selecting a message at a fifth input as an output message at a third output;

in a next iteration, selecting the message at the sixth input as an output message at the third output.

The foregoing are only implementations of the present disclosure, but the scope of protection of the present disclosure is not limited thereto. Any variation or permutation readily contemplated by those skilled in the art within the scope of the present disclosure should be covered within the scope of protection of the present disclosure. Therefore, the scope of protection of this disclosure shall be subject to the scope of the claims.

What is claimed is:

1. A decoder, wherein a check matrix corresponding to a frame of code words comprises $\alpha*\alpha$ sub-matrices, a plurality of sub-matrices located in the same row in the check matrix constitute a layer of the check matrix, and a plurality of sub-matrices located in the same column constitute a column of the check matrix, the decoder comprising:

a check node updating circuit that comprises first updating units of $\alpha$ levels, wherein the first updating unit of each level is connected sequentially; and a variable node updating circuit that is connected with the check node updating circuit, the variable node updating circuit comprises second updating units of $\alpha$ levels, wherein the second updating unit of each level is connected sequentially; wherein, in a first time period, the check node updating circuit is configured to cause: the first updating unit of each level except the first updating unit of a first level sequentially receive variable node messages corresponding to each column of the check matrix, and sequentially calculate the received variable node messages with messages in the first updating unit of a previous level, to obtain the check node messages corresponding to different layers of the check matrix in the first updating units of different levels in the first updating units of $\alpha$ levels;

in the first time period, the variable node updating circuit is configured to cause: the second updating unit of the $\alpha$-th level sequentially receive the variable node messages corresponding to each column of the check matrix, and the second updating unit of each level except the second updating unit of the $\alpha$-th level sequentially receive the messages of the second updating unit of a next level and performing calculation, to obtain corresponding intermediate calculation values in the second updating units of different levels in the second updating units of $\alpha$ levels; and in a second time period after the first time period, the variable node updating circuit is configured to cause: the second updating unit of each level except the second updating unit of the $\alpha$-th level sequentially receive the check node messages corresponding to each layer of the check matrix, and sequentially calculate the received check node messages with the intermediate calculation values of the second updating unit of the next level, to obtain the variable node messages corresponding to different columns of the check matrix in the second updating units of different levels in the second updating units of $\alpha$ levels.

2. The decoder of claim 1, wherein the first updating unit of each level comprises a first delaying unit, and the first updating unit of the first level to $\alpha$-1-th level also each comprises a first shifting unit, the first updating unit of a second level to $\alpha$-th level also each comprises a comparing unit; wherein the first delaying unit is configured to delay outputting of the messages updated in the first updating unit of each level, the first shifting unit is configured to shift the messages updated in the first updating unit, and the comparing unit is configured to compare the messages shifted in the first updating unit of the previous level with the received variable node messages to obtain a minimum value.

3. The decoder of claim 2, wherein the check node updating circuit is configured to:

in the second time period, close the comparing unit in the first updating unit of the second level to $\alpha$-th level.

4. The decoder of claim 2, wherein the second updating unit of each level each comprises a second delaying unit, and the second updating unit of the first level to $\alpha$-1-th level also each comprises an addition unit and a second shifting unit; wherein the second delaying unit is configured to delay outputting of the messages updated in the second updating unit of each level, the second shifting unit is configured to shift the messages updated in the second updating units, and the addition unit is configured to add the messages in the second updating unit of the next level and the received variable node messages.

5. The decoder of claim 4, wherein a shift value of the first shifting unit in the first updating unit of n-th level is equal to the shift value of the second shifting unit in the second updating unit of the n-th level; and wherein n is less than or equal to a.

6. The decoder of claim 4, wherein a delay duration of the first delaying unit of the first updating unit of each level is h1, and the delay duration of the second delaying unit of the second updating unit of each level is h2, and wherein h1=h2.

7. The decoder of claim 1, wherein the decoder further comprises: a first selector comprising a first input, a second input and a first output, the first input is connected with the first updating unit of the α-th level, the second input is configured to receive all-zero messages, and the first output is connected with each of the second updating unit of the first level to α-1-th level;
the first selector is configured to:
in the first time period, select a message at the second input as an output message at the first output; and
in the second time period, select a message at the first input as an output message at the first output.

8. The decoder of claim 1, wherein the decoder further comprises: a second selector comprising a third input, a fourth input and a second output, the third input is configured to receiving the variable node messages corresponding to each column of the check matrix, the fourth input is connected with the second updating unit of the first level, and the second output is connected with the second updating unit of the α-th level;
the second selector is configured to:
in the first time period, select a message at the third input as an output message at the second output; and
in the second time period, select a message at the fourth input as an output message at the second output.

9. The decoder of claim 1, wherein:
the decoder further comprises a parity check circuit connected with the variable node updating circuit; and
the parity check circuit is configured to: receive the variable node messages of the variable node updating circuit, and substitute the received variable node messages into check equations for checking, if all the check equations are fulfilled, it is determined that the coding is successful; otherwise if not all the check equations are fulfilled, it is determined that the coding fails, and a next iteration is needed to update the check node messages and the variable node messages until the coding is successful or a maximum iteration count is reached.

10. The decoder of claim 9, wherein the decoder further comprises:
a third selector comprising a fifth input, a sixth input and a third output, the fifth input is configured to receiving initial channel messages corresponding to each column of the check matrix, the sixth input is connected with the second updating unit of the first level, and the third output is connected with each of the first updating units of the second level to α-th level;
the third selector is configured to:
in a first time period of a first iteration, select a message at the fifth input as an output message at the third output; and
in a first time period of a next iteration, select a message at the sixth input as an output message at the third output.

11. A memory system comprising:
a memory controller; and
a memory device coupled to the memory controller;
wherein the memory controller comprises a decoder, wherein a check matrix corresponding to a frame of code words comprises α*α sub-matrices, a plurality of sub-matrices located in the same row in the check matrix constitute a layer of the check matrix, and a plurality of sub-matrices located in the same column constitute a column of the check matrix, the decoder comprising:
a check node updating circuit that comprises first updating units of α levels, wherein the first updating unit of each level is connected sequentially; and
a variable node updating circuit that is connected with the check node updating circuit, the variable node updating circuit comprises second updating units of α levels, wherein the second updating unit of each level is connected sequentially; wherein,
in a first time period, the check node updating circuit is configured to cause: the first updating unit of each level except the first updating unit of a first level sequentially receive variable node messages corresponding to each column of the check matrix, and sequentially calculate the received variable node messages with messages in the first updating unit of a previous level, to obtain the check node messages corresponding to different layers of the check matrix in the first updating units of different levels in the first updating units of α levels;
in the first time period, the variable node updating circuit is configured to cause: the second updating unit of the α-th level sequentially receive the variable node messages corresponding to each column of the check matrix, and the second updating unit of each level except the second updating unit of the α-th level sequentially receive the messages of the second updating unit of a next level and performing calculation, to obtain corresponding intermediate calculation values in the second updating units of different levels in the second updating units of α levels; and
in a second time period after the first time period, the variable node updating circuit is configured to cause: the second updating unit of each level except the second updating unit of the α-th level sequentially receive the check node messages corresponding to each layer of the check matrix, and sequentially calculate the received check node messages with the intermediate calculation values of the second updating unit of the next level, to obtain the variable node messages corresponding to different columns of the check matrix in the second updating units of different levels in the second updating units of α levels.

12. The memory system of claim 11, wherein the first updating unit of each level comprises a first delaying unit, and the first updating unit of the first level to α-1-th level also each comprises a first shifting unit, the first updating unit of a second level to α-th level also each comprises a comparing unit; wherein the first delaying unit is configured to delay outputting of the messages updated in the first updating unit of each level, the first shifting unit is configured to shift the messages updated in the first updating unit, and the comparing unit is configured to compare the messages shifted in the first updating unit of the previous level with the received variable node messages to obtain a minimum value.

13. A decoding method, wherein during decoding a frame of code words with a check matrix including α*α sub-matrices, a plurality of sub-matrices located in the same row in the check matrix constitute a layer of the check matrix, and a plurality of sub-matrices located in the same column constitute a column of the check matrix, the method comprising:
in a first time period, first updating unit of each level except the first updating unit of a first level sequentially receiving variable node messages corresponding to each column of the check matrix, and sequentially calculating the received variable node messages with messages in the first updating unit of a previous level, to obtain the check node messages corresponding to different layers of the check matrix in the first updating units of different levels in the first updating units of α levels;

in the first time period, the second updating unit of the α-th level sequentially receiving the variable node messages corresponding to each column of the check matrix, and the second updating unit of each level except the second updating unit of the α-th level sequentially receiving the messages of the second updating unit of a next level and performing calculation, to obtain corresponding intermediate calculation values in the second updating units of different levels in the second updating units of α levels; and in a second time period, the second updating unit of each level except the second updating unit of the α-th level sequentially receiving the check node messages corresponding to each layer of the check matrix, and sequentially calculating the received check node messages with the intermediate calculation values of the second updating unit of the next level, to obtain the variable node messages corresponding to different columns of the check matrix in the second updating units of different levels in the second updating units of α levels.

14. The method of claim 13, wherein the first updating unit of each level comprises a first delaying unit, and the first updating unit of the first level to α-1-th level also each comprises a first shifting unit, the first updating unit of a second level to α-th level also each comprises a comparing unit; and the method comprises:
the first delaying unit delaying outputting of the messages updated in the first updating unit of each level, the first shifting unit shifting the messages updated in the first updating unit, and the comparing unit comparing the messages shifted in the first updating unit of the previous level with the received variable node messages to obtain a minimum value.

15. The method of claim 14, further comprises:
in the second time period, closing the comparing unit in the first updating unit of the second level to α-th level.

16. The method of claim 14, wherein the second updating unit of each level each comprises a second delaying unit, and the second updating unit of the first level to α-1-th level also each comprises an addition unit and a second shifting unit; and the method further comprises:
the second delaying unit delaying outputting of the messages updated in the second updating unit of each level, the second shifting unit shifting the messages updated in the second updating units, and the addition unit adding the messages in the second updating unit of the next level and the received variable node messages.

17. The method of claim 13, wherein a decoder further comprises: a first selector comprising a first input, a second input and a first output, the first input is connected with the first updating unit of the α-th level, the second input is configured to receive all-zero messages, and the first output is connected with each of the second updating unit of the first level to α-1-th level; and the method further comprises:
in the first time period, selecting a message at the second input as an output message at the first output; and
in the second time period, selecting a message at the first input as an output message at the first output.

18. The method of claim 13, wherein a decoder further comprises: a second selector comprising a third input, a fourth input and a second output, the third input is configured to receiving the variable node messages corresponding to each column of the check matrix, the fourth input is connected with the second updating unit of the first level, and the second output is connected with the second updating unit of the α-th level; and the method further comprises:
in the first time period, selecting a message at the third input as an output message at the second output; and
in the second time period, selecting a message at the fourth input as an output message at the second output.

19. The method of claim 13, wherein:
a decoder further comprises a parity check circuit connected with the variable node updating circuit; and
the method further comprises:
receiving the variable node messages of the variable node updating circuit, and substituting the received variable node messages into check equations for checking, if all the check equations are fulfilled, it is determined that the coding is successful; otherwise if not all the check equations are fulfilled, it is determined that the coding fails, and a next iteration is needed to update the check node messages and the variable node messages until the coding is successful or a maximum iteration count is reached.

20. The method of claim 19, wherein the decoder further comprises:
a third selector comprising a fifth input, a sixth input and a third output, the fifth input is configured to receiving initial channel messages corresponding to each column of the check matrix, the sixth input is connected with the second updating unit of the first level, and the third output is connected with each of the first updating units of the second level to α-th level; and the method further comprises:
in the first time period, selecting a message at a fifth input as an output message at a third output; and
in a next iteration, selecting the message at the sixth input as an output message at the third output.

* * * * *